(12) United States Patent
Warner et al.

(10) Patent No.: US 6,940,916 B1
(45) Date of Patent: Sep. 6, 2005

(54) WIDEBAND ANALOG QUADRATURE MODULATOR/DEMODULATOR WITH PRE-COMPENSATION/POST-COMPENSATION CORRECTION

(75) Inventors: William Dean Warner, Maple Ridge (CA); Soon Sun Shin, Vancouver (CA); Andrew S. Wright, Vancouver (CA)

(73) Assignee: PMC-Sierra, Inc., Santa Clara, CA (US)

( * ) Notice: Subject to any disclaimer, the term of this patent is extended or adjusted under 35 U.S.C. 154(b) by 914 days.

(21) Appl. No.: 09/771,144

(22) Filed: Jan. 26, 2001

Related U.S. Application Data

(60) Provisional application No. 60/178,385, filed on Jan. 27, 2000.

(51) Int. Cl.[7] .......................... H04L 23/02; H04L 5/12
(52) U.S. Cl. ...................................... 375/261; 375/298
(58) Field of Search ................................ 375/219, 221, 375/261, 295–315; 455/126; 330/2

(56) References Cited

U.S. PATENT DOCUMENTS

| | | | |
|---|---|---|---|
| 3,950,750 A | | 4/1976 | Churchill et al. |
| 4,003,054 A | | 1/1977 | Goldstone |
| 5,369,411 A | | 11/1994 | Lisle, Jr. |
| 5,381,108 A | * | 1/1995 | Whitmarsh et al. ............ 330/2 |
| 5,802,451 A | * | 9/1998 | Adachi et al. .............. 455/126 |
| 5,872,538 A | | 2/1999 | Fowler |

FOREIGN PATENT DOCUMENTS

WO      WO 98/32221      7/1998

OTHER PUBLICATIONS

A.I. Sinsky, et al., *Error Analysis of a Quadrature Coherent Detector Processor*, IEEE Transactions On Aerospace and Electronic Systems, Nov. 1974, pp. 880-883.

F.E. Churchill, et al., *The Correction of I and Q Errors in a Coherent Processor*, IEEE Transactions On Aerospace And Electronic Systems, vol. AES-17, No. 1, Jan. 1981, pp. 131-137.

J Roome, *Analysis of quadrature detectors using complex envelope notation*, IEEE Proceedings, vol. 136, Pt. F, No. 2, Apr. 1989, pp. 95-100.

(Continued)

*Primary Examiner*—Stephen Chin
*Assistant Examiner*—Curtis Odom
(74) *Attorney, Agent, or Firm*—Knobbe, Martens, Olson & Bear, LLP

(57) ABSTRACT

The present invention is related to methods and apparatus that compensate for quadrature impairments of an analog quadrature modulator and/or demodulator over a relatively wide signal bandwidth. One embodiment pre-distorts baseband signals in a quadrature modulator compensation signal processor (QMCSP) to negate the quadrature impairment of an analog quadrature modulator and corrects a received baseband signal in a quadrature demodulator compensation signal processor (QDCSP) to cancel the quadrature impairment of an analog quadrature demodulator. The QMCSP and the QDCSP contain adaptive digital filter correction structures that pre-compensate and post-compensate, respectively, for the quadrature impairments introduced by the analog quadrature modulator and the analog quadrature demodulator over a relatively wide bandwidth. A phase shifter advantageously shifts the phase of a local oscillator signal to the analog quadrature demodulator to distinguish quadrature impairments introduced by the modulation path from quadrature impairments introduced by the demodulation path.

29 Claims, 19 Drawing Sheets

OTHER PUBLICATIONS

M. Faulkner, et al., *Automatic Adjustment Of Quadrature Modulators*, Electronics Letters, vol. 27, No. 3, Jan. 31, 1991, pp. 214-216.

J.K. Cavers, et al., *Adaptive Compensation for Imbalance and Offset Losses in Direct Conversion Transceivers*, IEEE Transactions On Vehicular Technology, vol. 42, No. 4, Nov. 1993, pp. 581-588.

A. Lohtia, et al., *An Adaptive Digital Technique For Compensating For Analog Quadrature Modulator/Demodulator Impairments*, IEEE Pac Rim 1993, pp. 447-450.

M. Faulkner, et al., *Adaptive Linearization Using Predistortion—Experimental Results*, IEEE Transactions On Vehicular Technology, vol. 43, No. 2, May 1994, pp. 323-332.

A. Mansell, et al., *Practical Implementation Issues For Adaptive Predistortion Transmitter Linearisation*, IEE, 1994.

S.A. Leyonhjelm, et al., *The Effect of Reconstruction Filters on Direct Upconversion in a Multichannel Environment*, IEEE Transactions On Vehicular Technology, vol. 44, No. 1, Feb. 1995, pp. 95-102.

A. Lohtia, et al., *Adaptive digital linearization of RF power amplifiers*, Can. J. Elect. & Comp. Eng., vol. 20, No. 2, 1995.

J.K. Cavers, *A Fast Method for Adaption Of Quadrature Modulators And Demodulators In Amplifier Linearization Circuits*, IEEE 1996, pp. 1307-1311.

G. Yang, et al., *I/Q Modulator Image Rejection Through Modulation Pre-distortion*, IEEE 1996, pp. 1317-1320

J.K. Cavers, *The Effect of Quadrature Modulator and Demodulator Errors on Adaptive Digital Predistorters for Amplifer Linearization*, IEEE Transactions On Vehicular Technology, vol. 46, No. 2, May 1997, pp. 456-466.

J.K. Cavers, *New Methods for Adaption of Quadrature Modulators and Demodulators in Amplifier Linearization Circuits*, IEEE Transactions On Vehicular Technology, vol. 48, No. 3, Aug. 1997, pp. 707-716.

K. Gerlach, et al., *An Adaptive Matched Filter that Compensates for I, Q Mismatch Errors*, IEEE Transactions On Signal Processing, vol. 45, No. 12, Dec. 1997, pp. 3104-3107.

R. Marchesani, *Digital Precompensation of Imperfections in Quadrature Modulators*, IEEE Transactions On Communications, vol.48, No. 4, Apr. 2000, pp. 552-556.

J.D. Owen, *A Comparison Of Wide Bandwidth Quadrature Demodulators Using Computer Modelling*, date and origin not known.

* cited by examiner

WIDEBAND ANALOG QUADRATURE MODULATOR/DEMODULATOR WITH PRE-COMPENSATION/POST-COMPENSATION CORRECTION

RELATED APPLICATION

This application claims the benefit under 35 U.S.C. § 119(e) of U.S. Provisional Application No. 60/178,385, filed Jan. 27, 2000, the disclosure of which is hereby incorporated by reference.

BACKGROUND OF THE INVENTION

1. Field of the Invention

The present invention is generally related to communications systems. In particular, the present invention relates to Intermediate Frequency (IF) or Radio Frequency (RF) modulators and demodulators.

2. Description of the Related Art

A component frequently found in a radio frequency (RF) transmitter/receiver (transceiver) is a quadrature modulator (QM) and/or quadrature demodulator (QD). A QM, which is also referred to as a quadrature multiplexer, modulates an intermediate frequency (IF) or an RF signal with the contents of two baseband signals. The baseband signals can include time-varying amplitude, phase, and/or frequency information. A QD demodulates, detects, or demultiplexes received IF or RF signals to recover the baseband signals.

The two baseband signals are referred to as a real or in-phase signal (often denoted by 'I'), and an imaginary or quadrature-phase signal (often denoted by 'Q'), and can also be described as one signal with an in-phase portion and a quadrature-phase portion. The QM mixes or multiplies each of the two baseband signals with a corresponding sinusoid or sine wave. Desirably, the two sinusoids that mix with the baseband signals are of the same amplitude, equal frequency, zero mean, i.e., no DC component, and have 90-degrees of phase separation. Conventionally, both sinusoids are derived from a common local oscillator (LO). Similarly, the QD recovers the two baseband signals by mixing a received signal with two sinusoids, again, derived from the same LO.

Conventional techniques for QM and/or QD include both digital-based and analog-based circuits. A digital-based QM or QD provides relatively accurate quadrature modulation and demodulation, but is relatively complex and expensive. Digital-based quadrature modulation/demodulation requires relatively high conversion rates from digital-to-analog converters and from analog-to-digital converters. Also, where relatively high conversion rates are desired, a digital-based QM or QD frequently requires the addition of a frequency up-converter or a frequency down-converter, respectively, thereby adding expense to the QM or QD. Further, image-rejection filters that accompany the up-converter add additional cost to a digital-based QM.

An analog-based QM or QD is desirably less expensive than a digital-based QM or QD. A typical analog-based QM directly converts to the Intermediate Frequency (IF) or to the Radio Frequency (RF) without the need for a frequency up-converter or the frequency up-converter's associated filters. Moreover, an analog-based QM or QD typically allows the use of lower-speed and less expensive digital-to-analog converters and analog-to-digital converters than a digital-based QM or QD.

Disadvantageously, conventional analog-based QM or QD circuits exhibit less accuracy in the modulation or multiplexing process than digital-based QM or QD circuits. Deviations from an ideal quadrature modulation or demodulation are generally referred to herein as "quadrature impairments." Quadrature impairments can result from conditions such as gain imbalance, phase imbalance, and local oscillator (LO) feed-through. These conditions can be caused by component variability and by variations with respect to temperature, frequency, power, aging, time, and the like. Further, related components such as digital-to-analog converters and reconstruction filters can also contribute to quadrature impairment.

Gain imbalance occurs where the two sinusoids have unequal power, when the two baseband signals (input signals to the quadrature modulator, or output signals from the quadrature demodulator) are amplified/attenuated by different amounts by the quadrature modulation or demodulation device or by supporting hardware, e.g., filters and the like. Phase imbalance occurs in situations such as where the two sinusoids used in the quadrature modulation/demodulation process exhibit a phase relationship that deviates from 90-degrees, where there are differences in the group delay between the I and Q circuit paths, and the like.

LO feed-through occurs when power at the frequency of the LO used to generate the two sinusoids of the QM process is undesirably present in the output of the quadrature modulator. The power present at the LO frequency disadvantageously wastes valuable output power. Similarly, undesired coupling of the LO into a quadrature demodulator results in an undesirable DC offset in the recovered baseband signals.

Conventional compensation techniques for quadrature impairment are inadequate. Conventional techniques pre-distort the baseband signals to/from the quadrature modulator/demodulator to compensate for the quadrature impairment. However, conventional techniques suffer from several drawbacks, such as relatively low performance and relatively high cost.

Conventional compensation techniques are limited in compensation bandwidth and do not adequately compensate for quadrature impairment across an entire band. Some conventional techniques employ computationally intensive Fourier transform computations to extend the bandwidth of computation, but are still relatively limited in bandwidth.

Conventional compensation techniques can also require the use of injected test signals to determine coefficients or parameters used to compensate for the impairment. Such use of injected test signals is not feasible in all applications because of the interruption to the transmission of the baseband signals that occurs while the test signals are injected. Circuits and switches to inject test signals also add cost to the compensation system.

Conventional compensation techniques have also used diode detectors to detect an envelope of a quadrature modulated waveform. Diode detectors add to the cost of a system and are also sensitive to temperature, aging, and other environmental effects, and often require periodic recalibration. Further, a detector diode typically does not provide an ideal response, such as a predictable linear or logarithmic response, to an RF signal, which thereby limits the amount of compensation attainable with such diode detectors. In addition, detector diodes can vary over frequency, thereby further limiting the compensation capability of such systems.

Where a modulator includes both QM and QD, conventional compensation techniques fail to distinguish between the quadrature impairment caused by the quadrature modulator and the quadrature impairment caused by the quadrature demodulator.

SUMMARY OF THE INVENTION

The present invention is related to methods and apparatus that compensate for quadrature impairments of an analog quadrature modulator and/or demodulator over a relatively wide signal bandwidth. One embodiment pre-distorts baseband signals in a quadrature modulator compensation signal processor (QMCSP) to compensate for the quadrature impairment of an analog quadrature modulator and compensates a received baseband signal in a quadrature demodulator compensation signal processor (QDCSP) to cancel the quadrature impairment of an analog quadrature demodulator. The QMCSP and the QDCSP contain adaptive digital filter correction structures that pre-compensate and post-compensate, respectively, for the quadrature impairments introduced by the analog quadrature modulator and the analog quadrature demodulator over a relatively wide bandwidth. The signal processors can be implemented with any chip responsive to instructions to process an input signal. Such signal processors can include dedicated hardware, general purpose digital signal processors (DSP), or even general purpose microprocessors configured to behave as a DSP.

One embodiment includes a phase shifter, which advantageously shifts the phase of a local oscillator to the analog quadrature demodulator to distinguish quadrature impairments introduced by the modulation path from quadrature impairments introduced by the demodulation path. One embodiment further includes a termination switch to similarly distinguish DC offsets introduced by the modulation path from DC offsets introduced by the demodulation path. The compensation improves the performance characteristics of the analog quadrature modulator and/or demodulator, thereby allowing deployment of relatively high-performance quadrature modulators and/or demodulators with relatively inexpensive analog-based circuits rather than relatively expensive digital-based circuits.

One embodiment according to the present invention provides an inexpensive and efficient compensation system for quadrature modulation impairment that is generally applicable over a relatively wide signal bandwidth. This allows relatively high data transmission rates and relatively high accuracy quadrature modulation without the need for expensive components such as relatively high-speed digital-to-analog converters and frequency up-converters. Such compensation can be advantageously updated to adapt to changing quadrature modulation impairment characteristics without interruption to the normal data stream to the quadrature modulators. Another embodiment provides compensation for quadrature demodulation impairment that is also generally applicable over a relatively wide signal bandwidth.

Compensation for both the quadrature modulation impairment and the quadrature demodulation impairment can be combined. One compensation system further includes a phase shifter, which advantageously enables the combined system to identify impairment due to quadrature modulation from impairment due to quadrature demodulation. This allows the system to more effectively update the correction parameters to compensate for the impairment.

An embodiment according to the present invention includes a quadrature modulator compensation signal processor that digitally filters an input signal to pre-distort or pre-compensate the input signal for a wideband quadrature impairment of a downstream analog quadrature modulator system. One digital filter includes a configuration of at least three finite impulse response (FIR) filters that apply the compensating impulse response. In one embodiment, the digital filter includes a configuration of four FIR filters.

Another embodiment according to the present invention includes a quadrature demodulator compensation signal processor that digitally filters a quadrature demodulated signal to compensate for a wideband quadrature impairment applied to the quadrature demodulated signal by an upstream analog quadrature demodulator system. Advantageously, the quadrature demodulator compensation signal processor can be implemented in firmware. One digital filter for the quadrature demodulator compensation signal processor includes a configuration of at least three FIR filters that apply the compensating impulse response. In one embodiment, the digital filter includes a configuration of four FIR filters.

Another embodiment according to the present invention includes a variable phase shifter that is adapted to shift the phase of a local oscillator signal to an analog quadrature demodulator system. The phase shifter can rotate the local oscillator signal to at least 3 phase shifts. Systems advantageously apply the phase shifts to the analog quadrature demodulator system to distinguish quadrature impairments produced by the analog quadrature demodulator system from quadrature impairments produced by the analog quadrature modulator system.

One embodiment according to the present invention further compares the input to a quadrature modulator with a feedback signal generated by demodulating the quadrature modulated output of the quadrature modulator. The feedback signal can include data stored and manipulated in memory. The compensation processing associated with the forward path to the quadrature modulator and the compensation processing associated with the reverse path from the quadrature demodulator are sporadically updated to reduce an error between the input signal and the feedback signal.

BRIEF DESCRIPTION OF THE DRAWINGS

These and other features of the invention will now be described with reference to the drawings summarized below. These drawings and the associated description are provided to illustrate preferred embodiments of the invention, and not to limit the scope of the invention.

DETAILED DESCRIPTION OF PREFERRED EMBODIMENTS

Glossary of mathematical symbols:

$x^*(t)$: The "*" symbol indicates complex conjugation of the function or data value to which it is applied.

$x(t)y(t)$: The "" symbol indicates convolution of the two signals.

$x \cdot y$: The "•" symbol indicates multiplication of the two signals or data values.

Although this invention will be described in terms of certain preferred embodiments, other embodiments that are apparent to those of ordinary skill in the art, including embodiments which do not provide all of the benefits and features set forth herein, are also within the scope of this invention. Accordingly, the scope of the present invention is defined only by reference to the appended claims.

An embodiment of the present invention advantageously compensates for quadrature impairments of an analog quadrature modulator and/or demodulator over a relatively wide signal bandwidth. Reduction of quadrature impairment is desirable because quadrature impairment is a factor that limits the ability of a receiver to separate adjacent carrier signals. The compensation improves the performance characteristics of the analog quadrature modulator and/or demodulator, thereby allowing deployment of relatively high-performance quadrature modulators and/or demodulators with relatively inexpensive analog-based circuits rather than relatively expensive digital-based circuits.

Embodiments of the present invention are well-suited to demanding applications such as wide-band third generation cellular base-station designs, e.g., wide-band CDMA (W-CDMA). Such applications typically demand multiple carrier amplification with relatively high linearity and relatively high efficiency.

Conventional systems, with limited bandwidth modulators, separately quadrature up-convert each carrier signal. The carrier signals are then combined with analog RF power combiner devices to generate the multiple carrier signal. By contrast, an embodiment according to the present invention can up-convert multiple carrier signals in a single quadrature up-conversion chain, thereby obviating the need for multiple modulators and power combiners. Rather than combine multiple-carriers at IF or RF, the multiple signals can be economically combined digitally at baseband.

Figure 1:
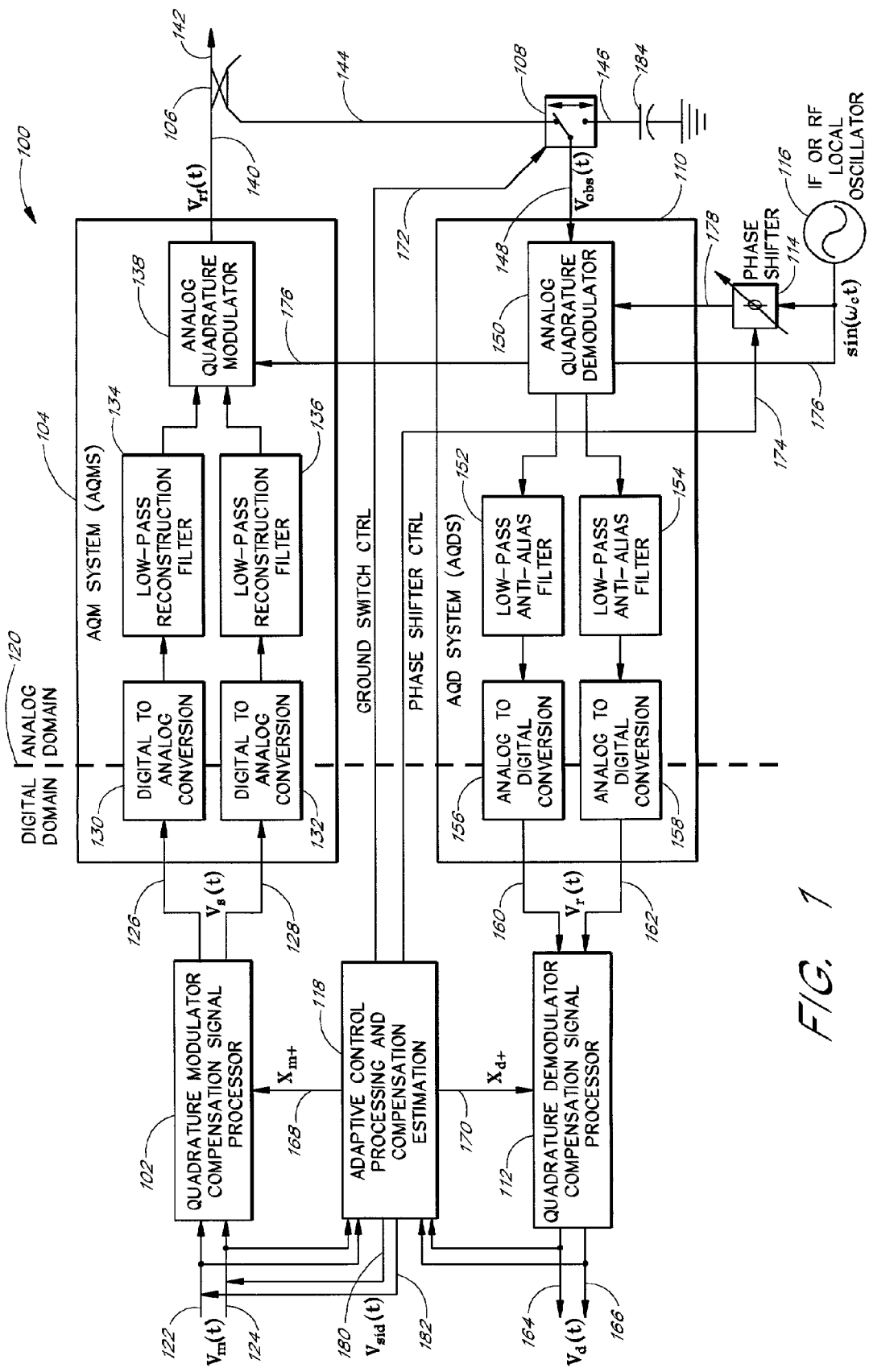
FIG. 1 illustrates a block diagram of an Analog Quadrature Modulator/Demodulator System according to one embodiment of the present invention.

FIG. 1 illustrates a block diagram of an Analog Quadrature Modulator/Demodulator (AQMD) system 100 according to one embodiment of the present invention. The AQMD system 100 shown includes compensation for both analog quadrature modulator impairment and analog quadrature demodulator impairment.

The AQMD System 100 includes a quadrature modulator compensation signal processor (QMCSP) 102, an analog quadrature modulator system (AQMS) 104, a coupler 106, a termination switch 108, an analog quadrature demodulator system (AQDS) 110, a quadrature demodulator compensation signal processor (QDCSP) 112, a variable phase shifter 114, a local oscillator (LO) 116, and an adaptive control processing and compensation estimation (ACPCE) circuit 118. Line 120 indicates where the data signals transition to/from digital and analog.

The QMCSP 102 receives baseband input signals 122, 124, $V_m(t)$, and pre-compensates or converts the input signals 122, 124 to the digital compensated signals 126, 128, $V_s(t)$. The input signals 122, 124 can conform to either narrow-band signals or wide-band signals. In addition, one of the input signals 122, 124 is frequently referred to as the real or in-phase signal ("I") and the other input signal is frequently referred to as the imaginary or quadrature-phase signal ("Q"). The input signals 122, 124 can conform to a variety of modulation schemes or combinations thereof. In addition, the input signals 122, 124 can include multiple signals that have been digitally combined at baseband.

The digital compensated signals 126, 128 are pre-compensated by the QMCSP 102 from the input signals 122, 124 to complement or negate the impairment of the AQMS 104 so that a resulting AQMS output signal 140, $V_r(t)$, exhibits substantially reduced quadrature impairment than without the compensation. Further details of the QMCSP 102 are described later in connection with FIG. 6.

The AQMS 104 receives the digital compensated signals 126, 128 and generates the AQMS output signal 140. Digital-to-analog converters 130, 132 convert the digital compensated signals 126, 128 from digital to analog. The analog outputs of the digital-to-analog converters 130, 132 are low-pass filtered by reconstruction filters 134, 136, which remove quantization noise and signal harmonics appearing at integer multiples of the digital-to-analog converter sampling rate. The low-pass filtered analog outputs are applied as inputs to an analog quadrature modulator 138, which generates the AQMS output signal 140 by mixing the two-baseband signals with an in-phase sinusoid and a quadrature-phase sinusoid, which derive from the LO 116. The illustrated AQMS 104 impairs the generated AQMS output signal 140 by introducing errors or variances in the digital-to-analog conversion process, low-pass filtering process, and/or quadrature modulation process. Various sources of the quadrature impairment due to the AQMS 104 are described in greater detail later in connection with FIG. 2.

The AQMS 104 shown in FIG. 1 is representative of a conventional analog-based circuit. However, many variations for an analog-based quadrature modulator exist, and the quadrature impairment compensation techniques disclosed herein apply generally to analog-based quadrature modulators, regardless of configuration.

The AQMS output signal 140 can conform to an intermediate frequency (IF) or a radio frequency (RF). A coupler 106 apportions the AQMS output signal 140 to an AQMD system output signal 142 and a sample signal 144. In one embodiment, the coupler 106 is configured so that the power coupled to the sample signal 144 is relatively low compared to the power coupled to the AQMD system output signal 142. The coupler can be placed in the data flow either upstream of a power amplifier or after amplification by the power amplifier.

In an application such as a cellular base-station, the AQMD system output signal 142 is typically coupled to an RF amplifier and transmitted with an antenna. Of course, the AQMD system output signal 142 can be further combined with other signals before they are transmitted. Where the AQMD system output signal 142 is in IF, a frequency up-conversion process can convert the AQMD system output signal 142 from IF to RF before it is amplified and transmitted.

In one embodiment, the sample signal 144 is applied as an input to the termination switch 108. The termination switch 108 switches between the sample signal 144 and a ground signal 146 in response to the state of a ground switch control signal 172 in order to provide an observation signal 148, $V_{obs}(t)$. By terminating the observation signal 148 to ground, the AQMD system 100 can detect and compensate for undesirable direct current (DC) offsets of the AQDS 110. Of course, the termination switch 108 can be constructed from electronic switches or mechanical switches. Preferably, the termination is alternating current (AC) coupled to ground through, for example, a series capacitor 184 to prevent the introduction of a DC offset in the input of the AQDS 110. In other embodiments, the termination to ground includes configurations with direct connections to ground and configurations with connections to ground through termination resistors. Further details of the termination switch 108 are described later in connection with FIGS. 6 and 10.

The AQDS 110 receives the observation signal 148 as an input and generates received baseband signals 160, 162, $V_r(t)$. The received baseband signals 160, 162 again conform to an in-phase signal ("I") and a quadrature-phase signal ("Q"). The illustrated AQDS 110 includes an analog quadrature demodulator 150, low-pass anti-alias filters 152, 154, and analog-to-digital converters 156, 158. The analog quadrature demodulator 150 mixes the observation signal 148 with an in-phase sinusoid and a quadrature-phase sinusoid derived from the LO 116 to generate analog baseband signals. The analog baseband signals are low-pass filtered by the low-pass anti-alias filters 152, 154 and applied as inputs to the analog-to-digital converters 156, 158, which generate the received baseband signals 160, 162. In addition, the AQDS 110 can further include components such as a low noise amplifier for the observation signal 148 and signal amplifiers for the inputs of the analog-to-digital converters 156, 158.

The received baseband signals 160, 162 are applied as inputs to the QDCSP 112, which converts the received baseband signals 160, 162 to the demodulated baseband signals 164, 166, $V_d(t)$. In one embodiment, the signal processing by the QDCSP 112 is performed in non-real time and within a microprocessor or a general purpose digital signal processor (DSP) by firmware. Of course, the QDCSP 112 can also be implemented with dedicated hardware. In one embodiment, the depicted demodulated baseband signals 164, 166 are maintained in a memory device and accessed by the firmware. The QDCSP 112 corrects or compensates for the quadrature impairment in the received baseband signals 160, 162 so that the demodulated baseband signals 164, 166 exhibit substantially reduced quadrature impairment than without the correction.

The ACPCE circuit 118 characterizes the quadrature impairment behavior of the AQMS 104 and the AQDS 110. In the illustrated embodiment, the ACPCE circuit 118 monitors the input signals 122, 124 and the demodulated baseband signals 164, 166. In other embodiments, the ACPCE circuit 118 monitors other signals, such as the digital compensated signals 126, 128 and the received baseband signals 160, 162. The ACPCE circuit 118 also controls the termination switch 108 and the variable phase shifter 114 to measure the quadrature impairment characteristics. Upon analysis of the quadrature impairment and the subsequent determination of updated compensation parameters, the ACPCE circuit 118 updates the QMCSP 102 and the QDCSP 112 through a modulator state parameter update vector 168, $X_{m+}$, and the demodulator state parameter update vector 170, $X_{d+}$, respectively.

In one embodiment, the ACPCE circuit 118 includes two basic modes of operation: System Identification (SID) mode and System Acquisition and Tracking (SAT) mode. In the SID mode of operation, the ACPCE circuit 118 applies test signals 180, 182, $V_{std}(t)$, as inputs to the QMCSP 102 in place of the input signals 122, 124. The test signals 180, 182 enable the ACPCE circuit 118 to quickly calibrate the compensation circuit parameters for the QMCSP 102 and the QDCSP 112 by observation of the demodulated baseband signals 164, 166.

In the SAT mode of operation, the ACPCE circuit 118 does not apply test signals, but rather, observes the characteristics of the demodulated baseband signals 164, 166 with respect to the input signals 122, 124 from the transmission stream. Advantageously, the SAT mode of operation permits the ACPCE circuit 118 to update compensation parameters without disturbance to the transmission stream.

In either the SID or the SAT modes of operation, the ACPCE circuit 118 optionally switches the termination switch 108 to ground (AC or DC ground) via the ground switch control 172 to characterize the DC offset from the AQDS 110, and to thereby distinguish from DC offsets originating from the AQMS 104. In addition, the ACPCE circuit 118 also adjusts the phase shifting characteristics of the variable phase shifter 114 to distinguish quadrature impairment due to the AQMS 104 from quadrature impairment due to the AQDS 110 to enable the ACPCE circuit 118 to compute the appropriate correction parameters for each. Further details of the characterization of the quadrature impairments and the computation of state parameter update vectors are described later in connection with FIGS. 6 to 12.

Figure 2:
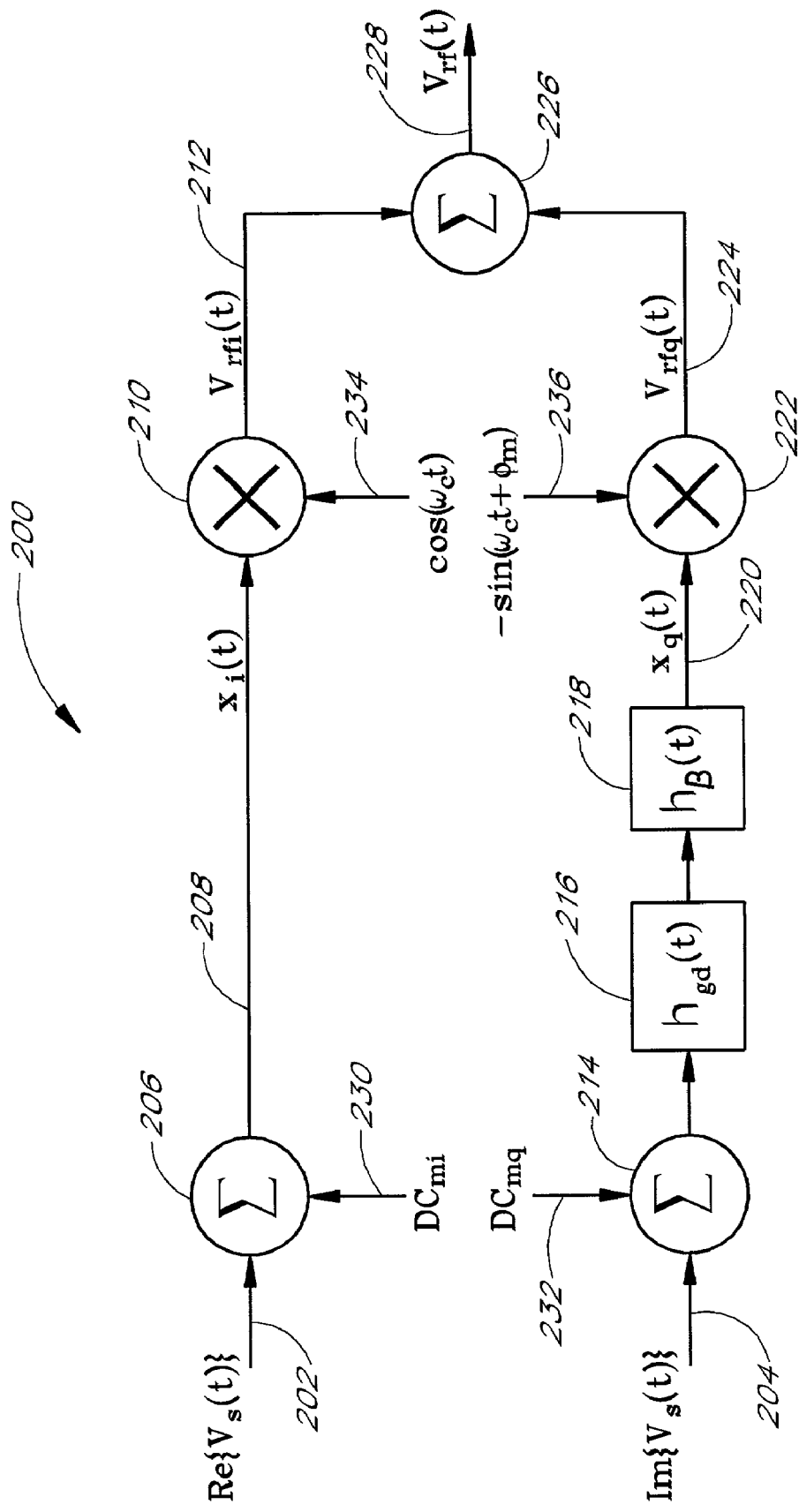
FIG. 2 illustrates a model of impairment in an Analog Quadrature Modulator System (AQMS).

FIG. 2 illustrates a model 200 of quadrature impairment in a conventional AQMS 104. The illustrated model 200 addresses quadrature impairments and does not represent a comprehensive model of the AQMS 104. The illustrated AQMS 104 of FIG. 1 includes digital-to-analog converters 130, 132. Actual digital-to-analog converters vary from ideal digital-to-analog converters with respect to a variety of parameters, including the presence of DC offsets and variations in gain. Further, where the digital-to-analog converters 130, 132 are two physically distinct devices, the impairments exhibited by the devices typically differ slightly between the two devices.

The illustrated AQMS 104 also includes reconstruction filters 134, 136. Typically, the reconstruction filters 134, 136 are two distinct devices and though identically designed, can vary in accordance with component variability, temperature, aging, and the like. Differences in the gain and the phase responses of the two reconstruction filters 134, 136 in the AQMS 104 give rise to gain and phase imbalances, which cause quadrature impairment.

The illustrated AQMS 104 includes the analog quadrature modulator 138. An actual analog quadrature modulator differs from an ideal quadrature modulator by introducing gain and phase imbalances to the output signal.

The model 200 includes the impairments described above. The model 200 can be used to characterize an actual AQMS, and subsequently compute coefficients or parameters for the QMCSP 102 to complement or negate the quadrature impairment introduced by the AQMS 104 so that the output of the AQMS 104 is substantially unimpaired.

The model 200 includes a first, a second, and a third summing nodes 206, 214, 226, a first and a second mixing nodes 210, 222, a group delay impulse response 216, and a gain impulse response 218.

The first and the second summing nodes 206, 214 receive the real portion of the input signal (or the in-phase or "I" channel) 202 and the imaginary portion of the input signal (or the quadrature-phase or "Q" channel) 204, respectively. The first summing node 206 models the DC offset from the digital-to-analog converter 130 by summing the real portion of the input signal 202 with signal $DC_{mi}$ 230 to produce the in-phase signal 208, $x_i(t)$. Similarly, the second summing node 214 models the DC offset from the digital-to-analog converter 132 by summing the imaginary portion of the input signal 204 with signal $DC_{mq}$ 232.

The in-phase signal 208, $x_i(t)$, is applied to the first mixing node 210, which multiplies the $x_i(t)$ in-phase signal 208 with $\cos(\omega_c t)$, a first oscillator signal 234, to produce $V_{rfi}(t)$, the in-phase RF signal 212. It will appreciated by those of ordinary skill in the art that the modeled in-phase RF signal 212 can conform to either an IF signal or an RF signal.

The output of the second summing node 214 is modified by the group delay impulse response 216 and the gain impulse response 218 to produce $x_q(t)$, the quadrature phase signal 220. The group delay impulse response 216 simulates a frequency-dependent group delay difference between the in-phase and the quadrature-phase channels. In the illustrated model, group delays common to both the in-phase and the quadrature-phase channels are ignored because these delays are not sources of quadrature impairment. The gain impulse response 218 similarly simulates a frequency-dependent gain difference between the in-phase and the quadrature-phase channels.

The second mixing node 222 multiplies the quadrature phase signal 220 and the second oscillator signal 236, which phase lags the first oscillator signal by about 90 degrees and is represented as $-\sin(\omega_c t + \Phi_m)$. In the model 200, the $\Phi_m$ term models for a relatively constant deviation from the ideal 90-degree phase difference between the first and the second oscillator signals 234, 236. The phase imbalance typically does not depend on the frequency of the input signal 202, 204, but depends on the frequency of the LO. Frequency dependent phase imbalances are taken into account by the group delay impulse response 216.

The third summing node 226 adds the in-phase RF signal 212 and the quadrature phase RF signal 224 to model the quadrature modulated signal 228. The modeled quadrature modulated signal 228 includes quadrature impairment, which simulates the quadrature impairment of an actual AQMS. The model 200 can be used to characterize the quadrature impairment AQMS to determine coefficients or parameters that are applied to the QMCSP 102 to compensate for the quadrature impairment of the AQMS. Of course, many variations on the model 200 are possible. For example, one or both of the group delay impulse response 216 or the gain impulse response 218 can be moved from the quadrature phase signal path to the in-phase signal path.

Figure 3:
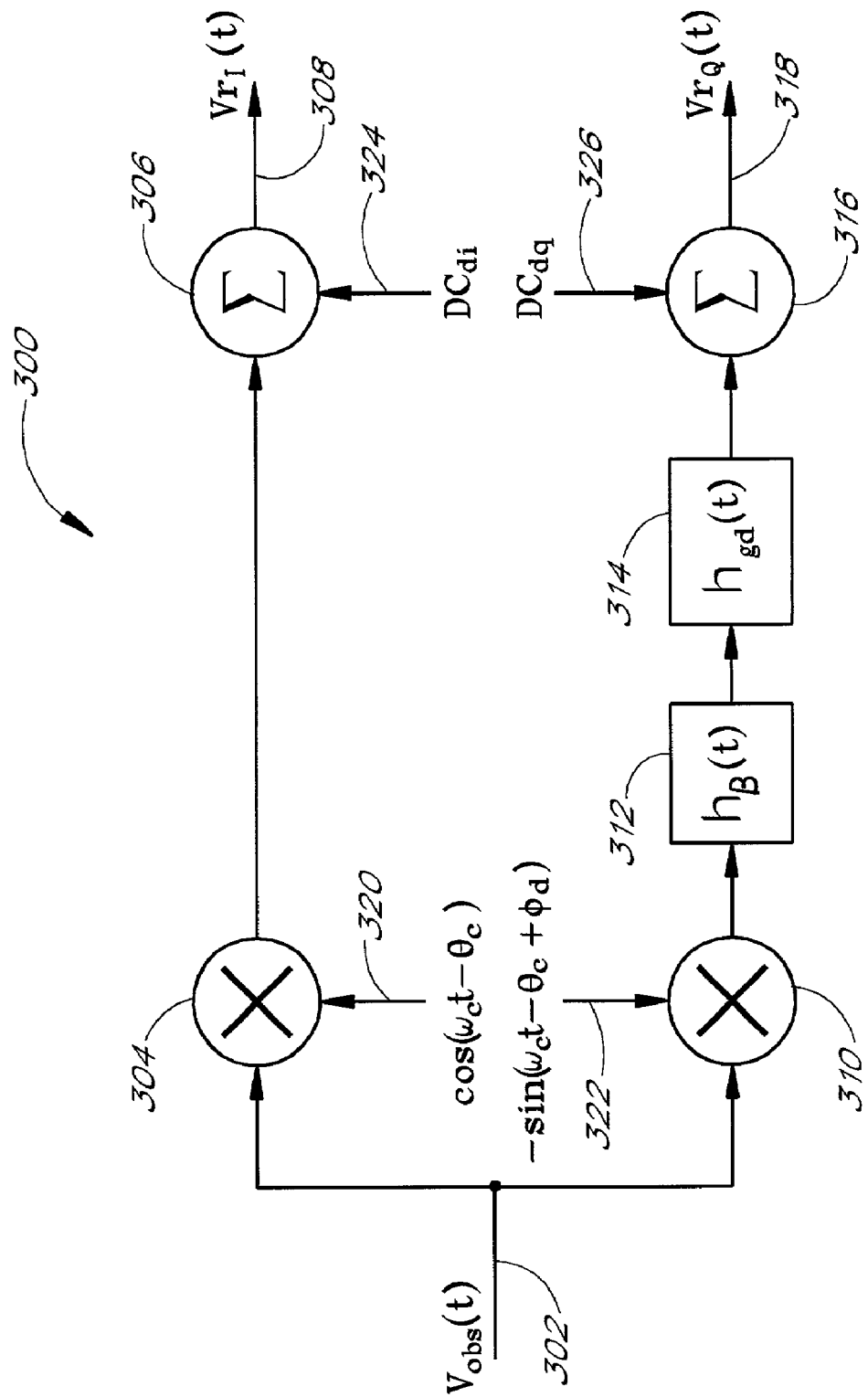
FIG. 3 illustrates a model of impairment in an Analog Quadrature Demodulator System (AQDS).

FIG. 3 illustrates a model 300 of quadrature impairment in a conventional AQDS 110. Again, the model 300 simulates quadrature impairments and does not represent a comprehensive model of the AQDS 110. An actual AQDS differs from an ideal AQDS in several aspects as actual components, such as the analog quadrature demodulator 150, the low-pass anti-alias filters 152, 154, and the analog-to-digital converters 156, 158, vary from ideal devices.

The model 300 includes a first and a second mixing nodes 304, 310 a first and a second summing nodes 306, 316, a gain impulse response 312, and a group delay impulse response 314. The first and the second mixing nodes 304, 310 mix an observation signal 302 with a first and a second oscillator signals 320, 322, respectively. The first oscillator signal 320, indicated by $\cos(\omega_c t - \theta_c)$ includes a phase deviation $\theta_c$, which simulates the phase difference between the LO signal 176 applied to the AQMS 104 and the phase shifted LO signal 178 applied to the AQDS 110. The second oscillator signal 322, indicated by $-\sin(\omega_c t - \theta_c + \Phi_d)$ is at about 90 degrees of phase lag relative to the first oscillator signal. The $\Phi_d$ term accounts for a constant deviation from the ideal 90 degrees of phase lag that exists in actual systems.

The gain impulse response 312 accounts for frequency-dependent gain differences (gain imbalance) between the in-phase and the quadrature-phase demodulation channels. The group-delay impulse response 314 accounts for the frequency-dependent group-delay difference (phase imbalance) between the in-phase and the quadrature-phase demodulation channels. These gain and phase imbalances are typically produced by the low-pass anti-alias filters 152, 154. In the quadrature demodulator impairment model 300, characteristics that do not result in quadrature impairment, such as frequency-dependent gain and frequency-dependent group-delay variations that are common to both the in-phase and the quadrature-phase demodulation channels are not included in the model. Further, the first and the second summing nodes 306, 316 simulate the DC offsets of analog-to-digital converters 156, 158.

The model can further include frequency-dependent gain and group-delay characteristics common to both the in-phase channel and the quadrature-phase channel. For simplicity, the common frequency-dependent gain and group-delay characteristics can be modeled by a transfer function, $H_{rf}(\omega)$, applied between the output signal $V_{rf}(t)$ 228 and the demodulator input signal 302. Further details of computing a solution to the model to compensate for quadrature impairment are described later in connection with FIG. 13.

Figure 4:
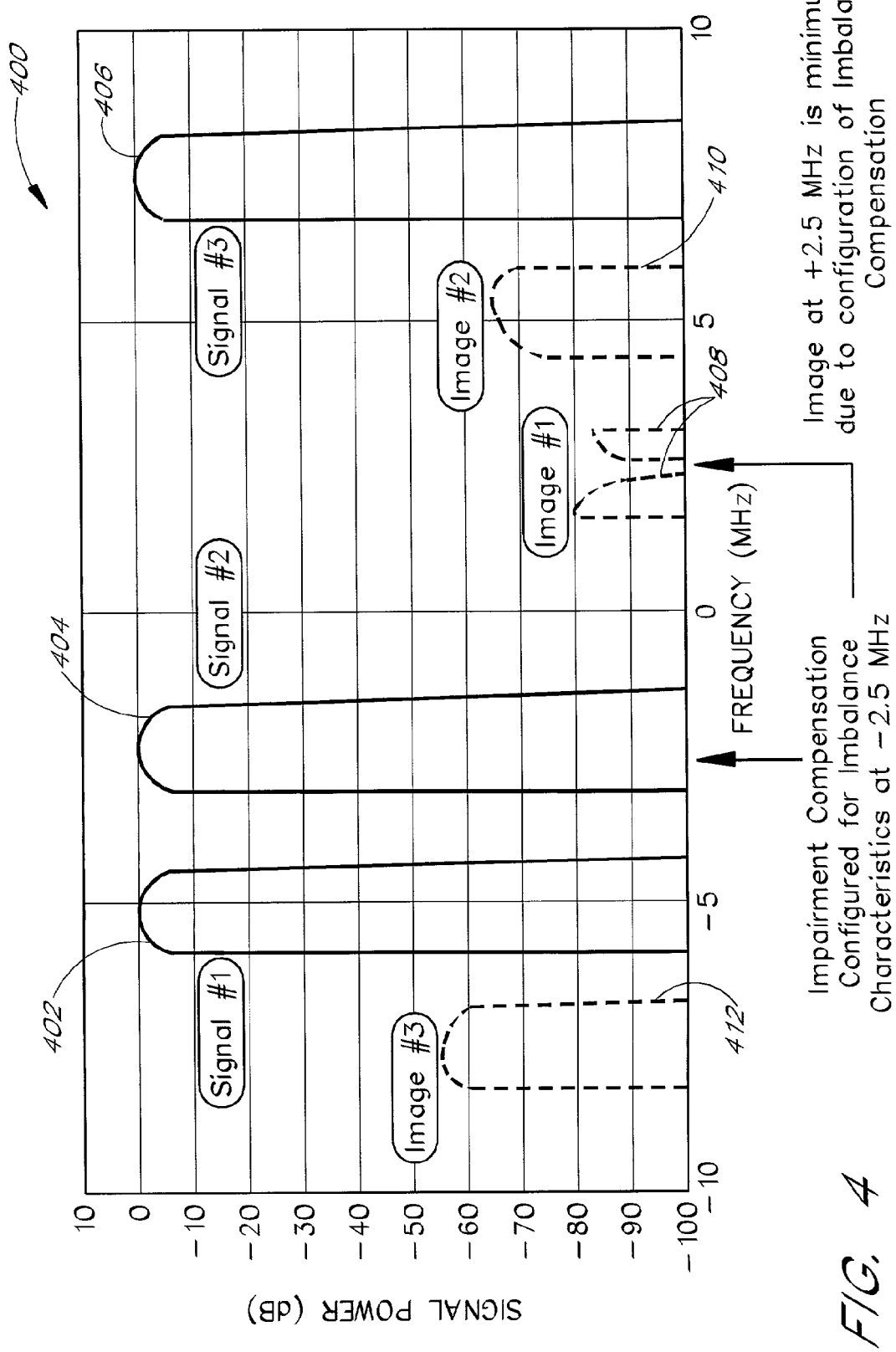
FIG. 4 is a graph of power versus frequency, which illustrates the effects of impairment in an AQMS.

FIG. 4 is a graph 400 of signal power versus frequency, which illustrates the effects of impairment in a conventional AQMS. The graph 400 is centered around the carrier frequency. Three main signals are modulated by the carrier at about −2.5 MHz, −5.0 MHz, and 7.5 MHz, respectively, relative to the carrier frequency or $\omega_c$. The artifacts of quadrature impairment manifest themselves by first, second, and third images 408, 410, 412 at about 2.5 MHz, 5.0 MHz, and −7.5 MHz, respectively, relative to the carrier frequency. Conventional quadrature impairment techniques can partially compensate for the quadrature impairment within a relatively narrow frequency range, such as indicated by the reduction in magnitude of a portion of the first image 408.

However, conventional quadrature impairment compensation techniques compensate only for fixed gain and phase imbalances by treating the gain and phase imbalances as constant over frequency. As such, conventional quadrature impairment techniques lack compensation for frequency dependent quadrature impairments and are ineffective at frequencies other than those where the AQMS or AQDS gain and phase imbalances happen to coincide with the compensation. The compensation provided by conventional techniques is thereby limited to a relatively narrow frequency range and is ill-suited to broadband modulation.

In contrast to conventional quadrature impairment techniques, embodiments of the present invention are capable of providing compensation for quadrature impairment across a relatively large bandwidth by compensating for frequency dependent quadrature impairment (including gain and phase imbalances) over a relatively large bandwidth. The applicable frequency bandwidths for quadrature modulation/demodulation impairment compensation include the frequency bands from about 1930 megahertz (MHz) to about 1990 MHz, from about 1850 MHz to about 1910 MHz, from about 2110 MHz to about 2170 MHz, from about 1900 MHz to about 1920 MHz, from about 2010 MHz to about 2025 MHz, from about 806 MHz to about 960 MHz, from about 1710 MHz to about 1885 MHz, and from about 2500 MHz to about 2690 MHz. Of course, other radio frequency bands can also be used and in one embodiment, the compensation is applied to IF signals which can be up-converted to an arbitrarily selected radio frequency.

Figure 5:
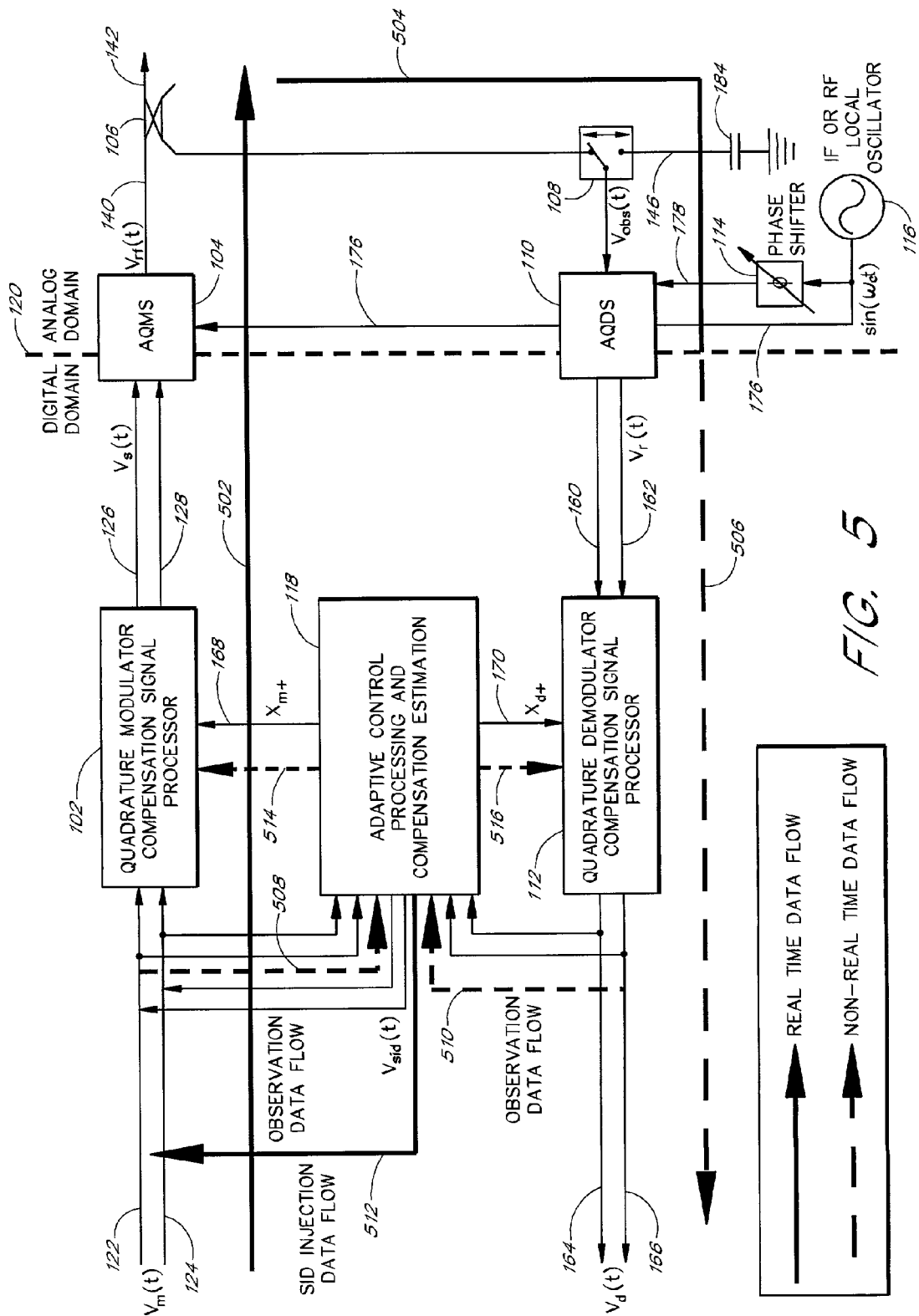
FIG. 5 illustrates a block diagram of the Analog Quadrature Modulator/Demodulator System of FIG. 1 with data flow.

FIG. 5 illustrates a block diagram of the Analog Quadrature Modulator/Demodulator System of FIG. 1 with the data flow according to one embodiment of the present invention. In FIG. 5, bold solid arrows indicate real time data flow and bold dashed arrows indicate non-real time data flow.

A forward data flow 502 typically operates in real time. The forward data flow 502 includes the direct flow of data and signals of the input signals 122, 124 to the AQMS output signal 140. The signal processing sample rate within the QMCSP is typically between 2 times and 4 times the information bandwidth of the input signals 122, 124. However, higher signal processing sample rates, such as between 8 times and 16 times the information bandwidth of the input signals 122, 124 can also be used.

The reverse data flow path includes a real time reverse data flow 504 and a non-real time reverse data flow 506. The reverse data flow path provides the ACPCE circuit 118 with a reverse observation flow 510, which the ACPCE circuit 118 uses to characterize the AQMS 104 and the AQDS 110. Although the AQMS 104 operates in real time, the AQDS can operate in either real time or non-real time. In the illustrated embodiment, the reverse observation flow 510 is monitored at the outputs demodulated baseband signals 164, 166, which are the outputs of the QDCSP 112. Of course, the reverse observation flow 510 can be monitored from another point, such as from the input of the QDCSP 112. The forward observation flow 508 in the illustrated embodiment monitors the input signals 122, 124 and can conform to either real time or non-real time.

In one embodiment, the forward observation flow 508 and the reverse observation flow 510 operate in real time for relatively short periods or bursts of time. During the bursts of time when the data is sampled from the forward observation flow 508 and the reverse observation flow 510, the AQDS 110 operates in real time and the analog-to-digital converters 156, 158 sample the data flow to satisfy the Nyquist criterion. However, outside the bursts of time, AQDS 110 and the QDCSP 112 can be advantageously placed in a power-saving or power-off mode.

For example, in one embodiment, the ACPCE circuit 118 receives and stores the forward observation flow 508 and the reverse observation flow 510 in real time for a relatively short burst duration. Preferably, the ACPCE circuit 118 receives the burst data periodically to enable the ACPCE circuit 118 to periodically update the compensation coefficients. The data collected is then later analyzed by the ACPCE circuit 118 to characterize the quadrature impairment of the AQMS 104 and/or the AQDS 110. It will be understood by one of ordinary skill in the art that such analysis takes into account the delay from the forward observation flow 508 to the reverse observation flow 510. Such delay can be caused, for example, by propagation delay in the QMCSP 102, the AQMS 104, the AQDS 110, the QDCSP 112, and other components or signal paths. The delay can be compensated by comparing time-shifted data, by adding a delay to the forward observation flow 510, and the like.

The analysis of the sample data flows need not occur in real time and can be economically performed by relatively low-performance and relatively low-power devices such as low-cost microprocessors and digital signal processors. The illustrated AQMD system 100 permits the control of a relatively wide-band open loop compensation quadrature modulator/demodulator design with an off-line closed loop controller. Advantageously, the illustrated AQMD system 100 is not constrained by operating bandwidth for the control loop. By contrast, typical real time closed loop systems are constrained by the loop delay with a limited operating bandwidth which is generally about a tenth of that of the open loop bandwidth.

In one embodiment, when the ACPCE circuit 118 activates the termination switch 108 to characterize DC offsets from the AQDS 110, the ACPCE circuit 118 also samples the non-real time reverse data flow 506 in a relatively short burst. When compensation coefficients have been calculated, the ACPCE circuit 118 applies the coefficients through the modulation compensation control/update flow 514 and the demodulation compensation control/update flow 516 to update the QMCSP 102 and the QDCSP 112, respectively. The modulation compensation control/update flow 514 and the demodulation compensation control/update flow 516 can be activated relatively infrequently, as the quadrature impairment characteristics of the AQMS 104 and the AQDS 110 generally change relatively slowly over time. In one embodiment, the ACPCE circuit 118 loads the QMCSP 102 and the QDCSP 112 with the updated parameters or coefficients and activates the newly loaded parameters or coefficients at substantially the same time to prevent the compensation of quadrature impairment with mismatched parameters.

Although the illustrated AQMD system 100 can compensate for the quadrature impairment for input signals 122, 124 with a relatively large bandwidth, in some applications of the AQMD system 100, the LO output 176 also varies in frequency. The quadrature impairment characteristics of the AQMS 104 and the AQDS 110 can change with LO frequency. One embodiment updates the coefficients or parameters of the QMCSP 102 and the QDCSP 112 in response to changes in frequency of the LO output 176.

When the test signal data flow 512 is activated by the ACPCE circuit 118, the ACPCE circuit 118 applies test signals to the input of the QMCSP 102 and samples the reverse observation flow 510 to characterize the quadrature impairment with respect to the test signals. In another embodiment, the ACPCE circuit 118 applies test signals to the input of the AQMS 104. Of course, when the test signals are active, the ACPCE circuit 118 need not monitor the forward observation data flow 508.

Figure 6:
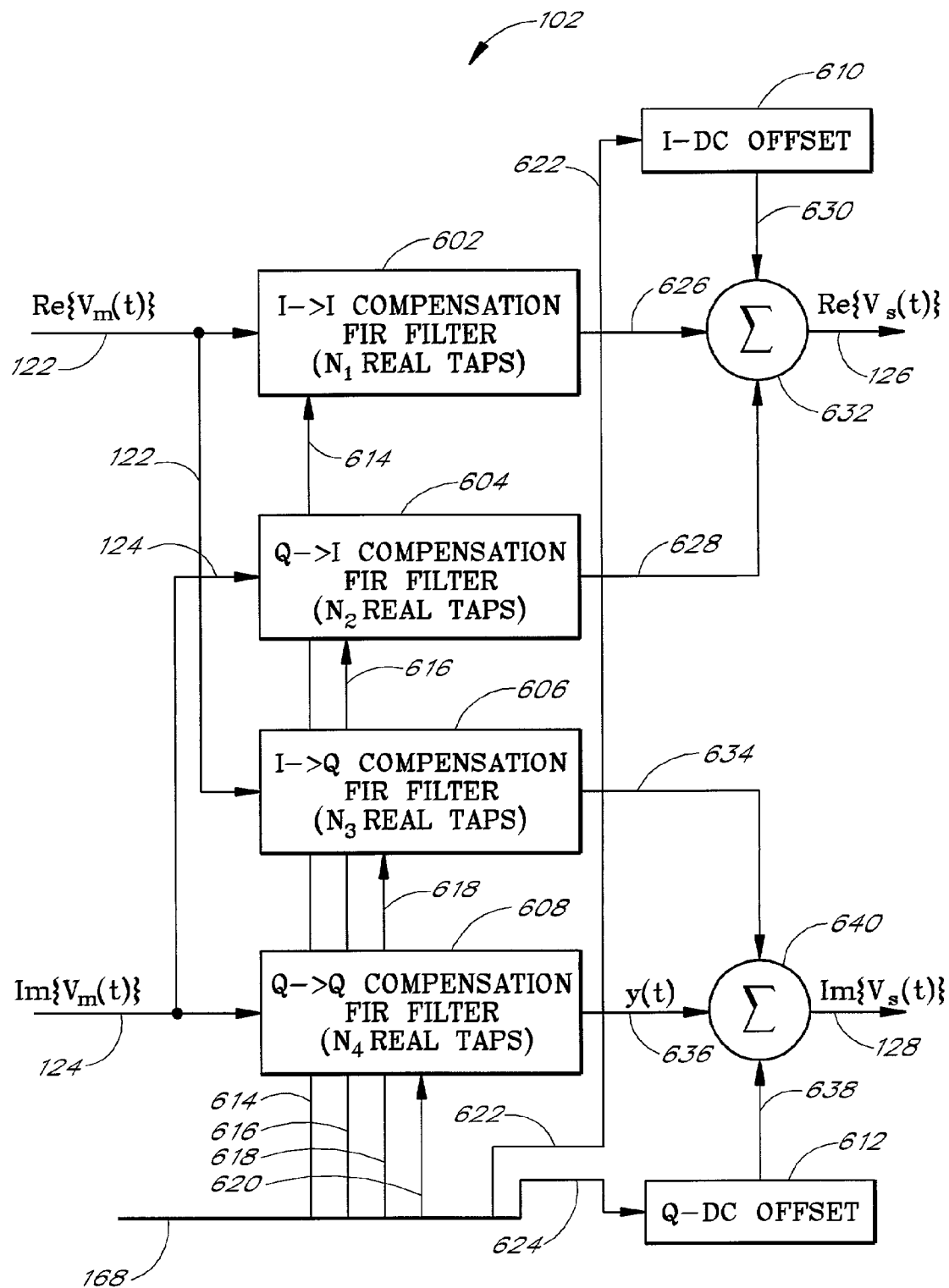
FIG. 6 illustrates one embodiment of a Quadrature Modulator Compensation Signal Processor (QMCSP) according to the present invention.

FIG. 6 illustrates one embodiment according to the present invention of a Quadrature Modulator Compensation Signal Processor (QMCSP) 102. The QMCSP 102 pre-compensates the input signals 122, 124 by applying one or more of phase rotation, propagation delay, amplitude scaling, DC offsets, and I-Q cross talk, to complement or negate the impairment of the corresponding AQMS 104 and reduce the quadrature impairment in the output signal 140 of the AQMS 104.

The illustrated QMCSP 102 includes an I-to-I compensation filter 602, a Q-to-I compensation filter 604, an I-to-Q compensation filter 606, a Q-to-Q compensation filter 608, an in-phase DC offset register 610, a quadrature-phase DC offset register 612, an in-phase adder 632, and a quadrature-phase adder 640. The compensation filters 602, 604, 606, 608 process the input signal 122, 124 to complement or negate the gain and phase imbalance of the AQMS 104. The DC offset registers 610, 612 negate the DC offset of the AQMS 104. Further details of the computation of the parameters for the DC offset registers 610, 612 are described later in connection with FIG. 10.

The outputs of the I-to-I compensation filter 602, the Q-to-I compensation filter 604, and the in-phase DC offset register 610 are summed by the in-phase adder 632 to provide the in-phase digital compensated signal 126. Similarly, the outputs of the I-to-Q compensation filter 606, the Q-to-Q compensation filter 608, and the quadrature-phase DC offset register 612 are summed by the quadrature-phase adder 640 to provide the quadrature-phase digital compensated signal 128. Exemplary impulse responses that characterize the compensation filters 602, 604, 606, 608 are described later in connection with FIGS. 8 and 9.

In one embodiment, the compensation filters 602, 604, 606, 608 are implemented as finite impulse response (FIR) filters. Preferably, the tap lengths $N_1$, $N_2$, $N_3$, and $N_4$ of the compensation filters 602, 604, 606, 608, respectively, are equal, i.e., $N_1=N_2=N_3=N_4$. Though it will be understood by one of ordinary skill in the art that the filter tap lengths can be unequal, equal length FIR tap lengths can simplify the computation of the appropriate filter tap coefficients. In one embodiment, the FIR filter tap coefficients conform to real numbers, i.e., not complex numbers. To further illustrate one embodiment of a compensation filter, the Q-to-Q compensation filter 608 is described in greater detail later in connection with FIG. 7.

The ACPCE circuit 118 computes the tap coefficients and the DC offsets, and the ACPCE circuit 118 updates the compensation filters 602, 604, 606, 608 through the modulator state parameter update vector 168. The modulator state parameter update vector 168 updates the I-to-I compensation filter 602, the Q-to-I compensation filter 604, the I-to-Q compensation filter 606, the Q-to-Q compensation filter 608, the in-phase DC offset register 610, and the quadrature-phase DC offset register 612 through the update vectors 614, 616, 618, 620, 622, 624. While the QMCSP 102 uses the modulator state parameters and processes the input signals 122, 124 in real time, the ACPCE circuit 118 typically analyzes and computes the modulator state parameters in non-real time. The characteristics of quadrature impairment change relatively slowly over time due to temperature effects, aging, and the like. Upon computation of update parameters, the ACPCE circuit 118 provides updates to the QMCSP 102 via the modulator state parameter update vector 168.

The number of filter taps in the FIR filters is a matter of design choice, typically depending on the performance requirements of the system and the severity of the AQMS impairments. In addition, where an AQMD system uses a digital-to-analog conversion sampling rate that is relatively high compared to the signal bandwidth, the compensation filters can have relatively few filter taps. However, where the AQMD system uses digital-to-analog conversion sampling rate that is relatively low, such as the minimum rate as defined by the Nyquist sampling criterion, the compensation filters can include a relatively large number of filter taps.

In an alternative embodiment, one of the Q-to-I compensation filter 604 or the I-to-Q compensation filter 606 is not included in the QMCSP 102. The filter not included can be effectively removed by, for example, setting the removed filter's filter coefficients to zero, or by simply not including the filter. Further details of this alternative embodiment are described later in connection with FIG. 18. In another embodiment, the compensation filters are constructed from infinite impulse response filters, Lattice filters, and the like. In addition, the QMCSP 102 can be combined with the QDCSP 112 as described later in connection with FIG. 15. In another embodiment of the QMCSP 102, the four compensation filters 602, 604, 606, 608 are substituted by two compensation filters, which use complex filter coefficients and the complex conjugate of the input signal to perform the calculations described above in addition to the unmodified signal.

Figure 7:
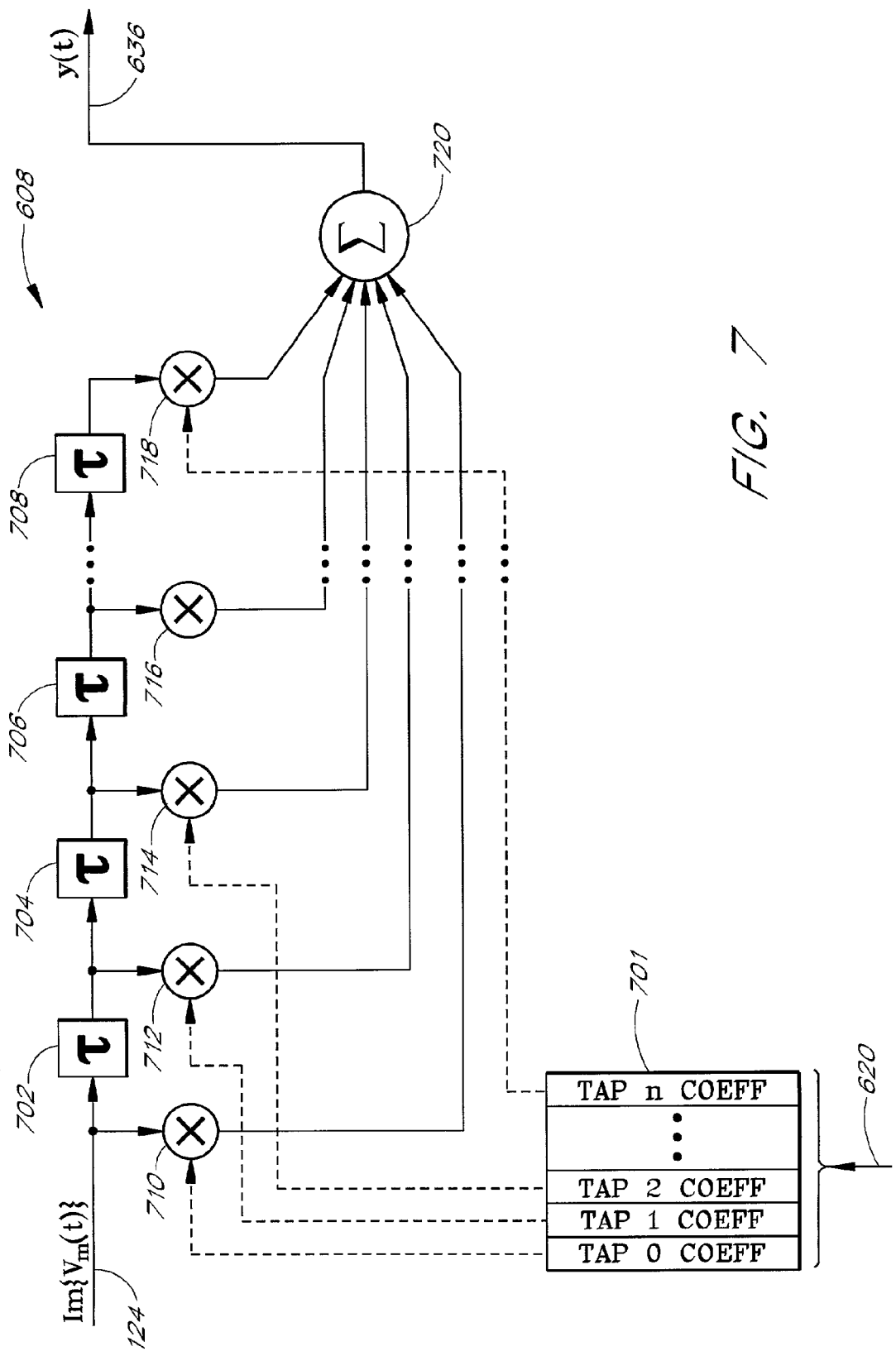
FIG. 7 illustrates one embodiment of an FIR Filter with updateable coefficients.

FIG. 7 illustrates further details of one embodiment of the Q-to-Q compensation filter 608. The other compensation filters 602, 604, 606 can be implemented by substantially the same structure shown in FIG. 7. The illustrated Q-to-Q compensation filter 608 is implemented as an FIR Filter with updateable coefficients. The Q-to-Q compensation filter 608 includes delays 702, 704, 706, 708, multipliers 710, 712, 714, 716, 718, and a summing circuit 720.

The bank of registers 701 stores the coefficients provided by the update vector 620. The coefficients are provided as inputs to the multipliers 710, 712, 714, 716, 718. Preferably, the bank of registers 701 is configured to receive the coefficients from the ACPCE circuit 118 and activate the coefficients at substantially the same time as the other coefficients used in the QMCSP 102 and/or the QDCSP 112. This allows the ACPCE circuit 118 to progressively load the updated coefficients or parameters without compensation by the QMCSP 102 and/or the QDCSP 112 with mismatched coefficients or parameters. Each multiplier multiplies its coefficient with the corresponding sample of the input signal, shown in FIG. 7 as a tap of the quadrature-phase input signal 124 and the delayed taps of the quadrature-phase input signal 124, which are available from the delays. As described in connection with FIG. 6, the number of taps is a matter of design choice. However, in practice, the number of taps (length of an FIR filter) in the QMCSP can be limited by a maximum delay specification for the AQMD system 100. The products of the taps and the coefficients are added by the summing circuit 720, which produces the Q-to-Q compensation filter output 636.

Figure 8:
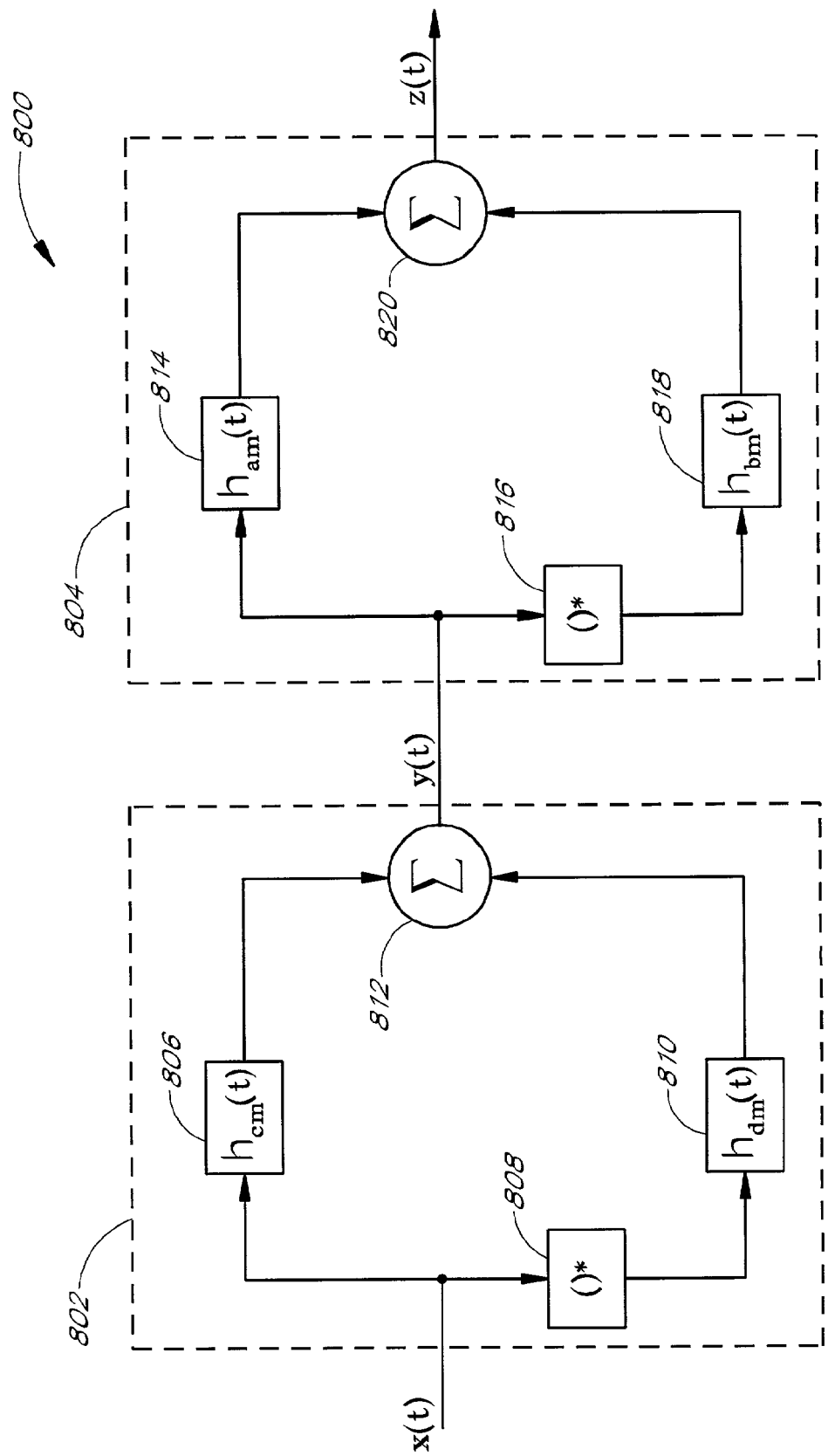
FIG. 8 is a time-domain block diagram of Quadrature Modulation Impairment Pre-Compensation and Quadrature Modulation Impairment.

FIG. 8 is a time-domain block diagram 800 of Quadrature Modulation Impairment 804 in the AQMS 104 and a corresponding Pre-Compensation 802 in the QMCSP 102 for the Quadrature Modulation Impairment 804. An input signal, labeled as x(t), is applied to the Pre-Compensation 802. The Pre-Compensation 802 produces an output, labeled as y(t), which is the sum 812 of the convolution of x(t) by impulse response $h_{cm}(t)$ 806 and the convolution of the complex conjugate 808 of x(t) by the impulse response $h_{dm}(t)$ 810.

When the output, y(t) of the Pre-Compensation 802 is applied as an input to the Quadrature Modulation Impairment 804, the output, labeled as z(t), of the Quadrature Modulation Impairment 804 is substantially less impaired. The output of the Quadrature Modulation Impairment 804, z(t), is the sum 820 of the convolution of y(t) by impulse response $h_{am}(t)$ 814 and the convolution of the complex conjugate 816 of y(t) by impulse response $h_{bm}(t)$ 818. Equation 1 describes the transformation from x(t) to z(t):

$$z(t)=x(t)[$$

$$h_{am}(t)h_{cm}(t)+h_{bm}(t)$$

$$+x^*(t)[h_{am}(t)h_{dm}(t)+h_{bm}$$

$$(t)h_{cm}^*(t)] \qquad \text{Eq. 1}$$

The impulse responses $h_{am}(t)$ 814 and $h_{bm}(t)$ 818 are obtained by characterizing the quadrature impairment of the AQMS 104 that is compensated.

The filter coefficients of the QMCSP 102 are selected so that the impulse responses $h_{cm}(t)$ 806 and $h_{dm}(t)$ 810 satisfy or approximately satisfy Equation 2:

$$h_{am}(t)h_{dm}(t)+h_{bm}(t)h_{cm}^*(t)=0 \qquad \text{Eq. 2}$$

Where the equality expressed in Equation 2 is reached or approximately reached, the compensation of the QMCSP 102 substantially reduces the quadrature impairment of the AQMS 104. Selection of the filter coefficients to satisfy or approximately satisfy Equation 2 is sufficient in many applications. However, the output signal z(t) may exhibit residual frequency dependent complex scaling and rotation relative to the input signal x(t).

Where frequency dependent complex scaling and rotation are also compensated, the filter coefficients of the QMCSP 102 are also selected to satisfy or approximately satisfy Equation 3, where $\delta(t)$ is the unit impulse function:

$$h_{am}(t)h_{cm}(t)+h_{bm}(t)h_{dm}^*(t)=\delta(t) \qquad \text{Eq. 3}$$

Figure 9:
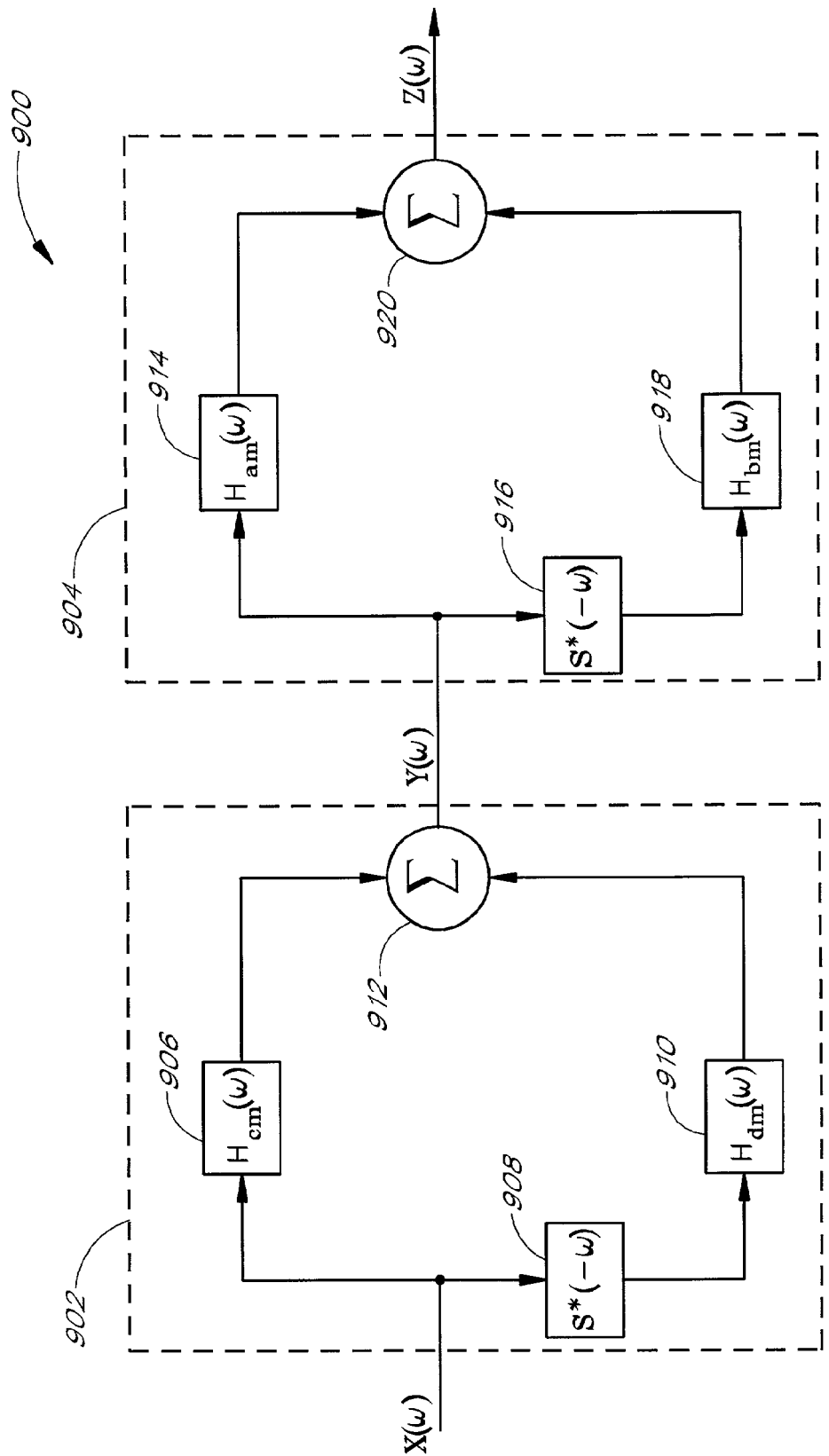
FIG. 9 is a frequency-domain block diagram of Quadrature Modulation Impairment Pre-Compensation and Quadrature Modulation Impairment.

FIG. 9 is a frequency-domain block diagram 900 of Quadrature Modulation Impairment 904 in the AQMS 104 and the corresponding Pre-Compensation 902 in the QMCSP 102 for the Quadrature Modulation Impairment 904. The Pre-Compensation 902 receives an input signal, labeled as $X(\omega)$. The Pre-Compensation 902 produces an output, labeled as $Y(\omega)$, which is the sum 912 of the product of $X(\omega)$ with a transfer function $H_{cm}(\omega)$ 906 and the product of the complex conjugate $S^*(-\omega)$ 908 of $X(\omega)$ with a transfer function $H_{dm}(\omega)$ 910.

When the output, $Y(\omega)$, of the Pre-Compensation 902 is applied as an input to the Quadrature Modulation Impairment 904, the output, labeled as $Z(\omega)$, of the Quadrature Modulation Impairment 904 is substantially less impaired. The output of the Quadrature Modulation Impairment 904, $Z(\omega)$, is the sum 920 of the product of $Y(\omega)$ with the transfer function $H_{am}(\omega)$ 914 and the product of the complex conjugate $S^*(-\omega)$ 916 of $Y(\omega)$ by transfer function $H_{bm}(\omega)$ 918. Equation 4 describes the transformation from $X(\omega)$ to $Z(\omega)$:

$$Z(\omega)=X(\omega)\cdot[H_{am}(\omega)\cdot$$

$$H_{cm}(\omega)+H_{bm}(\omega)\cdot H^*_{dm}$$

$$(-\omega)+X^*(-\omega)\cdot[H_{am}$$

$$(\omega)\cdot H_{dm}(\omega)+H_{bm}(\omega)\cdot$$

$$H^*_{cm}(-\omega)] \qquad \text{Eq. 4}$$

The transfer functions $H_{am}(\omega)$ 914 and $H_{bm}(\omega)$ 918 are obtained by characterizing the quadrature impairment of the AQMS 104 that is compensated. The filter coefficients of the QMCSP 102 are selected so that the transfer functions $H_{cm}(\omega)$ 906 and $H_{dm}(\omega)$ 910 satisfy or approximately satisfy Equation 5:

$$H_{am}(\omega)\cdot H_{dm}(\omega)+H_{bm}(\omega)H^*_{cm}(-\omega)=0 \qquad \text{Eq. 5}$$

Where the equality expressed in Equation 5 is reached or approximately reached, the compensation of the QMCSP 102 substantially reduces the quadrature impairment of the AQMS 104. Selection of the filter coefficients to satisfy or approximately satisfy Equation 5 is sufficient in many applications. However, the output signal $Z(\omega)$ may exhibit residual frequency dependent complex scaling and rotation relative to the input signal $X(\omega)$.

Where frequency dependent complex scaling and rotation are also compensated, the filter coefficients of the QMCSP 102 are additionally selected to satisfy or approximately satisfy Equation 6:

$$H_{am}(\omega)\cdot H_{cm}(\omega)+H_{bm}(\omega)\cdot H^*_{dm}(-\omega)=1 \qquad \text{Eq. 6}$$

As illustrated in Equation 6, computation of the transfer functions $H_{cm}(\omega)$ 906 and $H_{dm}(\omega)$ 910 in the frequency domain does not require the complicated task of computing convolutions. The transfer functions $H_{cm}(\omega)$ 906 and $H_{dm}(\omega)$ 910 can be computed for a relatively broad range of frequencies or for only the frequencies that are used by the AQMD system 100. For example, the ACPCE circuit 118 can characterize the quadrature impairment transfer function of the AQMS 104 by monitoring selected frequency signals present in the input signals 122, 124 or by injection of appropriate test signals, such as digitally constructed frequency sweeps, applied through the test signals 180, 182, where such frequency sweeps are permitted by the application.

After the compensation transfer functions $H_{cm}(\omega)$ 906 and $H_{dm}(\omega)$ 910 are determined for the frequencies of interest, the corresponding compensation impulse responses $h_{cm}(t)$ 806 and $h_{dm}(t)$ 810 can be computed by, for example, computation of the inverse Fourier transform or the inverse z-transform of $H_{cm}(\omega)$ 906 and $H_{dm}(\omega)$ 910, respectively. In one embodiment, the filter coefficients of the QMCSP 102 that implement the impulse responses $h_{cm}(t)$ 806 and $h_{dm}(t)$ 810 are selected to provide a white residual error and a minimum mean square error solution with respect to the impulse responses. Equations 7 illustrate impulse responses $h_{iim}(t)$, $h_{qim}(t)$, $h_{iqm}(t)$, and $h_{qqm}(t)$ for the I-to-I compensation filter 602, the Q-to-I compensation filter 604, the I-to-Q compensation filter 606, and the Q-to-Q compensation filter 608, respectively, described in connection with FIG. 6:

$$h_{iim}(t)=Re[h_{cm}(t)+h_{dm}(t)]$$

$$h_{qim}(t)=Im[-h_{cm}(t)+h_{dm}(t)]$$

$$h_{iqm}(t)=Im[h_{cm}(t)+h_{dm}(t)]$$

$$h_{qqm}(t)=Re[h_{cm}(t)-h_{dm}(t)] \qquad \text{Eqs. 7}$$

Figure 10:
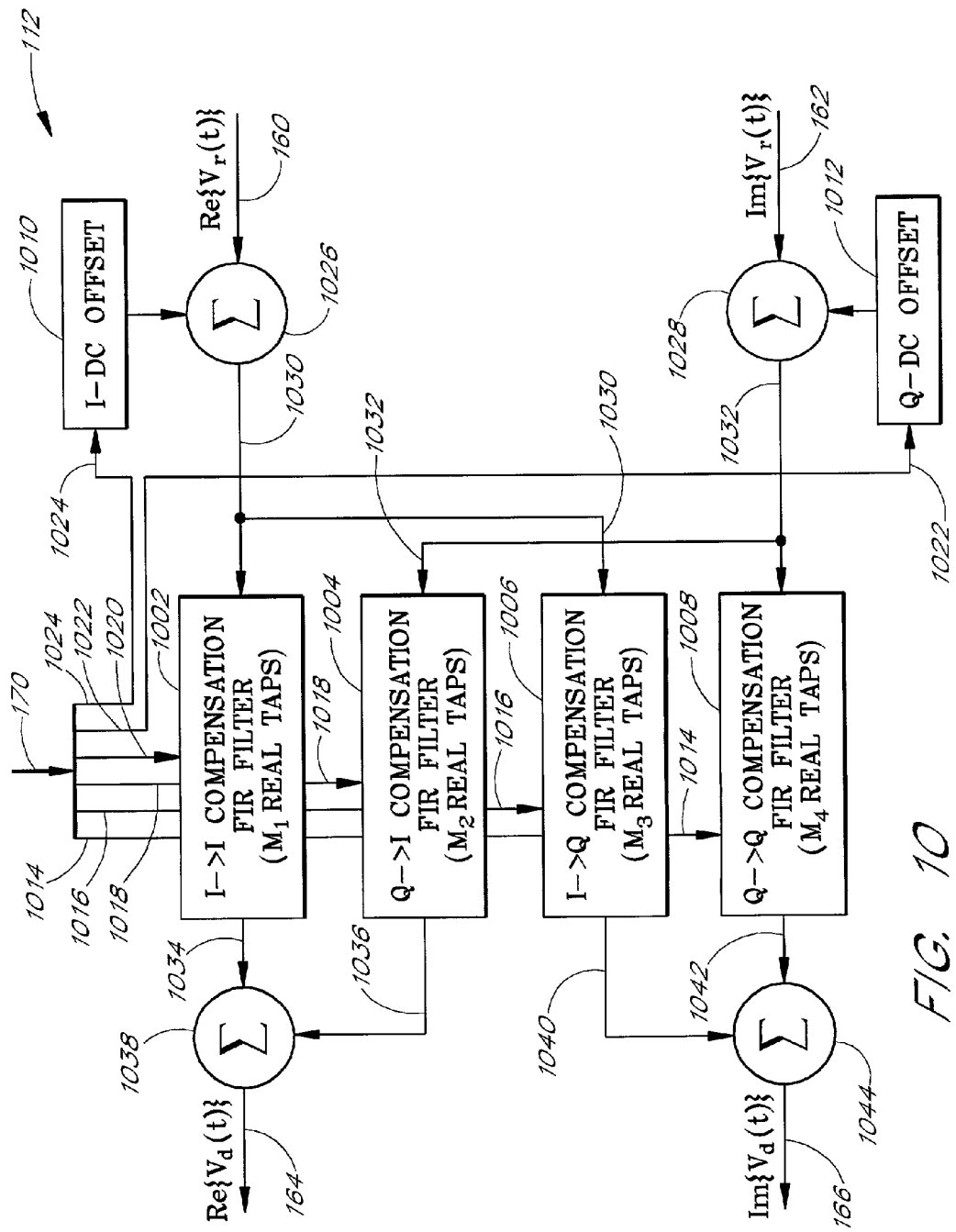
FIG. 10 illustrates one embodiment of a Quadrature Demodulator Compensation Signal Processor.

FIG. 10 illustrates one embodiment of a Quadrature Demodulator Compensation Signal Processor (QDCSP) 112. The QDCSP 112 compensates for the quadrature impairment in the received baseband signals 160, 162 by applying one or more of phase rotation, propagation delay, amplitude scaling, DC offsets, and I-Q cross talk, so that the demodulated baseband signals 164, 166 exhibit substantially reduced quadrature impairment than without the correction. In one embodiment, the QDCSP 112 receives and stores a relatively short burst of the received baseband signals 160, 162 in a memory device. The signal processing can be applied to the received signals off-line in non-real time and implemented by, for example, firmware executing in a DSP or a general-purpose microprocessor.

The illustrated QDCSP 112 includes an I-to-I compensation filter 1002, a Q-to-I compensation filter 1004, an I-to-Q compensation filter 1006, a Q-to-Q compensation filter 1008, an in-phase DC offset register 1010, a quadrature-phase DC offset register 1012, a first in-phase adder 1026, a first quadrature-phase adder 1028, a second in-phase adder 1038, and a second quadrature-phase adder 1044.

The first in-phase adder 1026 sums the output of the in-phase DC offset register 1010 with the in-phase portion of the received baseband signal 160 to remove the DC offset introduced by the AQDS 110. The first quadrature-phase adder 1028 similarly sums the output of the quadrature-phase DC offset register 1012 with the quadrature portion of the received baseband signal 162 to remove the DC offset introduced by the AQDS 110. Of course, DC offsets present in the received baseband signal 160, 162 can also be removed by summation at a different point, such as at the second in-phase adder 1038 and the second quadrature-phase adder 1044. When the termination switch 108 selects the sample signal 144 as the observation signal 148, DC offsets measured at the received baseband signals 160, 162 or the demodulated baseband signals 164, 166 include offsets from both the AQMS 104 and the AQDS 110.

In one embodiment, the ACPCE circuit 118 first measures and distinguishes the DC offsets of the AQMS 104 and the AQDS 110 by using the termination switch 108. The ACPCE circuit 118 then compensates for the DC offsets by updating offset registers 610, 612, 1010, 1012. The ACPCE circuit 118 activates the ground switch control 172 so that the termination switch 108 provides an AC ground to the observation signal 148, which is the input to the AQDS 110. The offset from ground of the AQDS 110 is then directly observable at the received baseband signals 160, 162 or at the demodulated baseband signals 164, 166. Of course, where DC offsets have already been added to the demodulated baseband signals 164, 166 through the DC offset registers 1010, 1012, the contributions to the offset from the DC offset registers 1010, 1012 are also taken into account. The ACPCE circuit 118 updates the demodulator DC offset registers 1010, 1012 so that the inverses, such as via 2's complement, of the observed AQDS 110 DC offset for the in-phase and the quadrature phase channels, respectively, are summed with the in-phase and the quadrature phase channels. Once the DC offset due to the AQDS is characterized and known, the ACPCE circuit 118 deactivates the ground switch control 172 to measure the DC offset due to the AQMS 104 and updates the AQMS pre-compensation DC offset registers 610, 612 to negate the DC offset of the AQMS 104.

In another embodiment, the ACPCE circuit 118 first measures and compensates for the AQDS 110 DC offset, and then computes the AQMS 104 DC offset during computation of the quadrature impairment compensation.

The I-to-I compensation filter 1002 and the I-to-Q compensation filter 1006 receive the output 1030 of the first in-phase adder 1026 and apply the impulse responses $h_{iid}(t)$ and $h_{iqd}(t)$, respectively, which are described later in connection with FIGS. 11 and 12. The Q-to-I compensation filter 1004 and the Q-to-Q compensation filter 1008 receive the output of the first quadrature-phase adder 1028 and apply the impulse responses $h_{qid}(t)$ and $h_{qqd}(t)$, respectively, which are also described later in connection with FIGS. 11 and 12.

The output 1034 of the I-to-I compensation filter 1002 and the output 1036 of the Q-to-I compensation filter 1004 are summed by the second in-phase adder 1038 to provide the in-phase demodulated baseband signal 164. Similarly, the output 1040 of the I-to-Q compensation filter 1006 and the output 1042 of the Q-to-Q compensation filter 1008 are summed by the second quadrature-phase adder 1044 to provide the quadrature-phase demodulated baseband signal 166. Exemplary impulse responses that characterize the compensation filters 1002, 1004, 1006, 1008 are described later in connection with FIGS. 11 and 12.

In one embodiment, the compensation filters 1002, 1004, 1006, 1008 are implemented as finite impulse response (FIR) filters. Preferably, the tap lengths $M_1$, $M_2$, $M_3$, and $M_4$ of the compensation filters 1002, 1004, 1006, 1008, respectively, are equal. Though it will be understood by one of ordinary skill in the art that the filter tap lengths can be unequal, equal length FIR tap lengths can simplify the computation of the appropriate filter tap coefficients. In one embodiment, the FIR filter tap coefficients conform to real numbers, i.e., not complex numbers. A more detailed example of an FIR filter is described in connection with FIG. 8.

The ACPCE circuit 118 computes the tap coefficients and the DC offsets and updates the compensation filters 1002, 1004, 1006, 1008 through the demodulator state parameter update vector 170. The demodulator state parameter update vector 170 updates the I-to-I compensation filter 1002, the Q-to-I compensation filter 1004, the I-to-Q compensation filter 1006, the Q-to-Q compensation filter 1008, the in-phase DC offset register 1010, and the quadrature-phase DC offset register 1012 through the update vectors 1014, 1016, 1018, 1020, 1022, 1024. Preferably, the QDCSP 112 is configured as described in connection with FIG. 7 to activate updated coefficients and parameters substantially simultaneously and yet allow the ACPCE circuit 118 to progressively load the updated coefficients or parameters to the QDCSP 112. For example, where the QDCSP 112 is implemented with firmware in a DSP or microprocessor, the processing by the DSP or microprocessor can be disabled when the coefficients are updated.

In one embodiment, both the QDCSP 112 uses the demodulator state parameters to process the received baseband signal 160, 162, and the ACPCE circuit 118 analyzes and computes the modulator state parameters in non-real time. The characteristics of quadrature impairment change relatively slowly over time due to temperature effects, aging, and the like. Upon computation of update parameters, the ACPCE circuit 118 provides updates to the QDCSP 112 via the demodulator state parameter update vector 170, which can, of course, be performed entirely within firmware.

In an alternative embodiment, one of the Q-to-I compensation filter 1004 or the I-to-Q compensation filter 1006 is not included in the QDCSP 112. The filter not included can be effectively removed by, for example, setting filter coefficients to zero, or by simply not including the filter in hardware or firmware. Further details of this alternative embodiment are described later in connection with FIG. 19.

The number of filter taps in the FIR filters is a matter of design choice, typically depending on the performance requirements of the system and the severity of the AQMS 104 and the AQDS 110 impairments. For example, where an AQMD system uses an analog-to-digital conversion sampling rate that is relatively high compared to the signal bandwidth, the compensation filters can have relatively few filter taps. However, where the AQMD system uses analog-to-digital conversion sampling rate that is relatively low, such as the minimum rate as defined by the Nyquist sampling criterion, the compensation filters can include a relatively large number of filter taps. In another embodiment, the compensation filters are constructed from infinite impulse response filters, Lattice filters, and the like.

Figure 11:
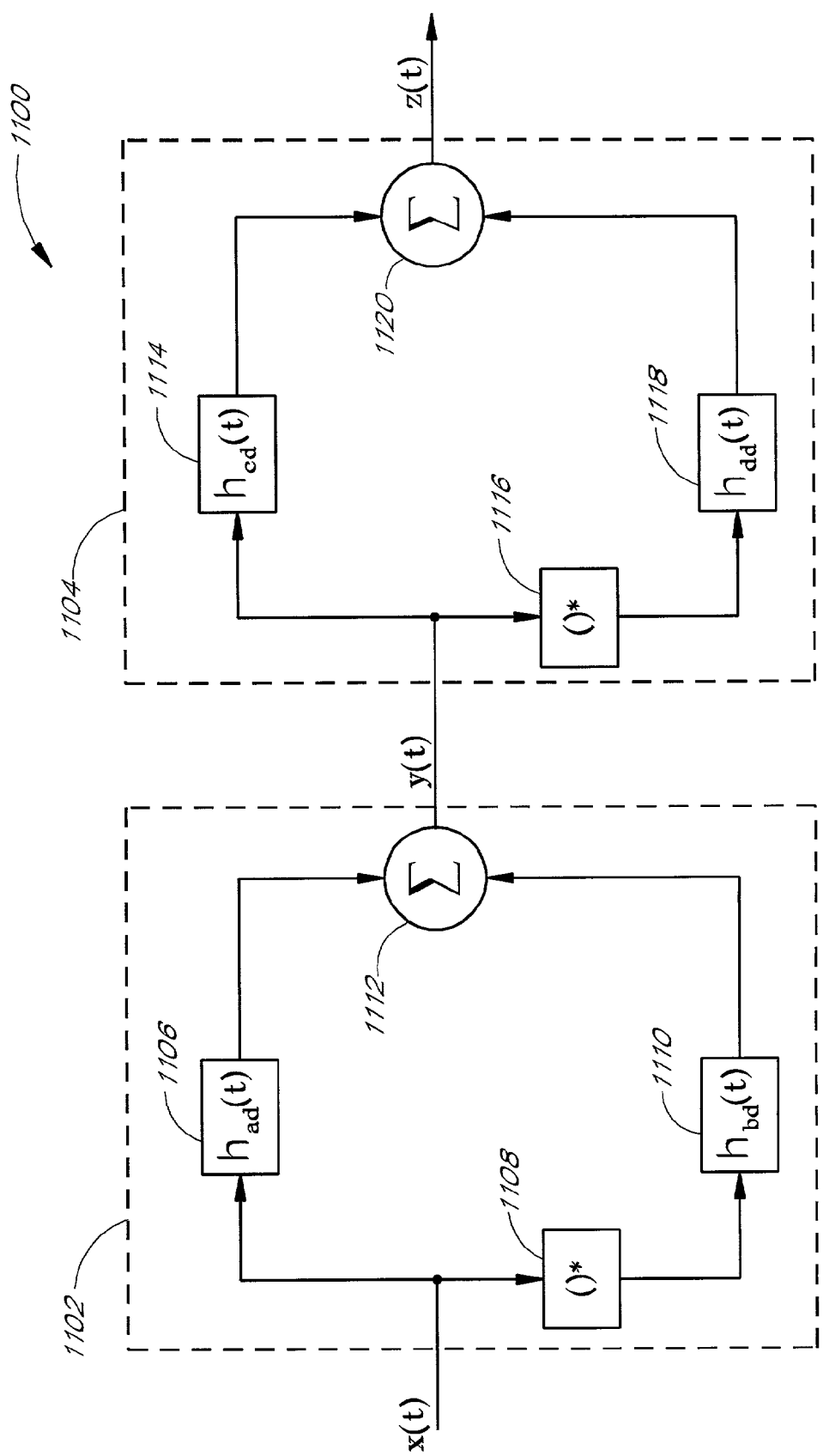
FIG. 11 is a time-domain block diagram of Quadrature Demodulation Impairment Pre-Compensation and Quadrature Demodulation Impairment.

FIG. 11 is a time-domain block diagram 1100 of Quadrature Demodulation Impairment 1102 introduced by the AQDS 110 and a corresponding Compensation 1104 in the QDCSP 112 for the Quadrature Demodulation Impairment 1102. An input signal, labeled as x(t), is applied to the Quadrature Demodulation Impairment 1102. The Quadrature Demodulation Impairment 1102 produces an output, labeled as y(t), which is the sum 1112 of the convolution of x(t) by impulse response $h_{ad}(t)$ 1106 and the convolution of the complex conjugate 1108 of x(t) by the impulse response $h_{bd}(t)$ 1110.

When the output of the Quadrature Demodulation Impairment 1102 is applied to the Compensation 1104, the output of the Compensation 1104, labeled as z(t), is substantially less impaired. The output of the Compensation 1104 is the sum 1120 of the convolution of y(t) by impulse response $h_{cd}(t)$ 1114 and the convolution of the complex conjugate 1116 of y(t) by impulse response $h_{dd}(t)$ 1118. Equation 8 describes the transformation from x(t) to z(t).

$$z(t)=x(t)$$
$$[h_{ad}(t)h_{cd}$$
$$(t)+h_{bd}*(t$$
$$+x^*(t)[h_{ad}*(t)$$
$$h_{dd}(t)+h_{bd}(t)h_{cd}$$
$$(t)]$$

Eq. 8

The impulse responses $h_{ad}(t)$ 1106 and $h_{bd}(t)$ 1110 are obtained by characterizing the quadrature impairment introduced by the AQDS 110 that is compensated.

The filter coefficients of the QDCSP 112 are selected so that the impulse responses $h_{cd}(t)$ 1114 and $h_{dd}(t)$ 1118 satisfy or approximately satisfy Equation 9.

$$h_{ad}*(t)h_{dd}(t)+h_{bd}(t)h_{cd}(t)=0$$

Eq. 9

Where the equality in Equation 9 is reached or approximately reached, the compensation of the QDCSP 112 substantially reduces the quadrature impairment of the AQDS 110. Selection of the filter coefficients to satisfy or approximately satisfy Equation 9 is sufficient in many applications. However, the output signal z(t) may exhibit residual frequency dependent complex scaling and rotation relative to the input signal x(t). The skilled practitioner will appreciate that where the QDCSP is implemented in firmware, the output signal z(t) can correspond to data in memory.

Where frequency dependent complex scaling and rotation are also compensated, the filter coefficients of the QDCSP 112 are also selected to satisfy or approximately satisfy Equation 10, where δ(t) is the unit impulse function:

$$h_{ad}(t)h_{cd}(t)+h_{bd}*(t)h_{dd}(t)=\delta(t)$$

Eq. 10

Figure 12:
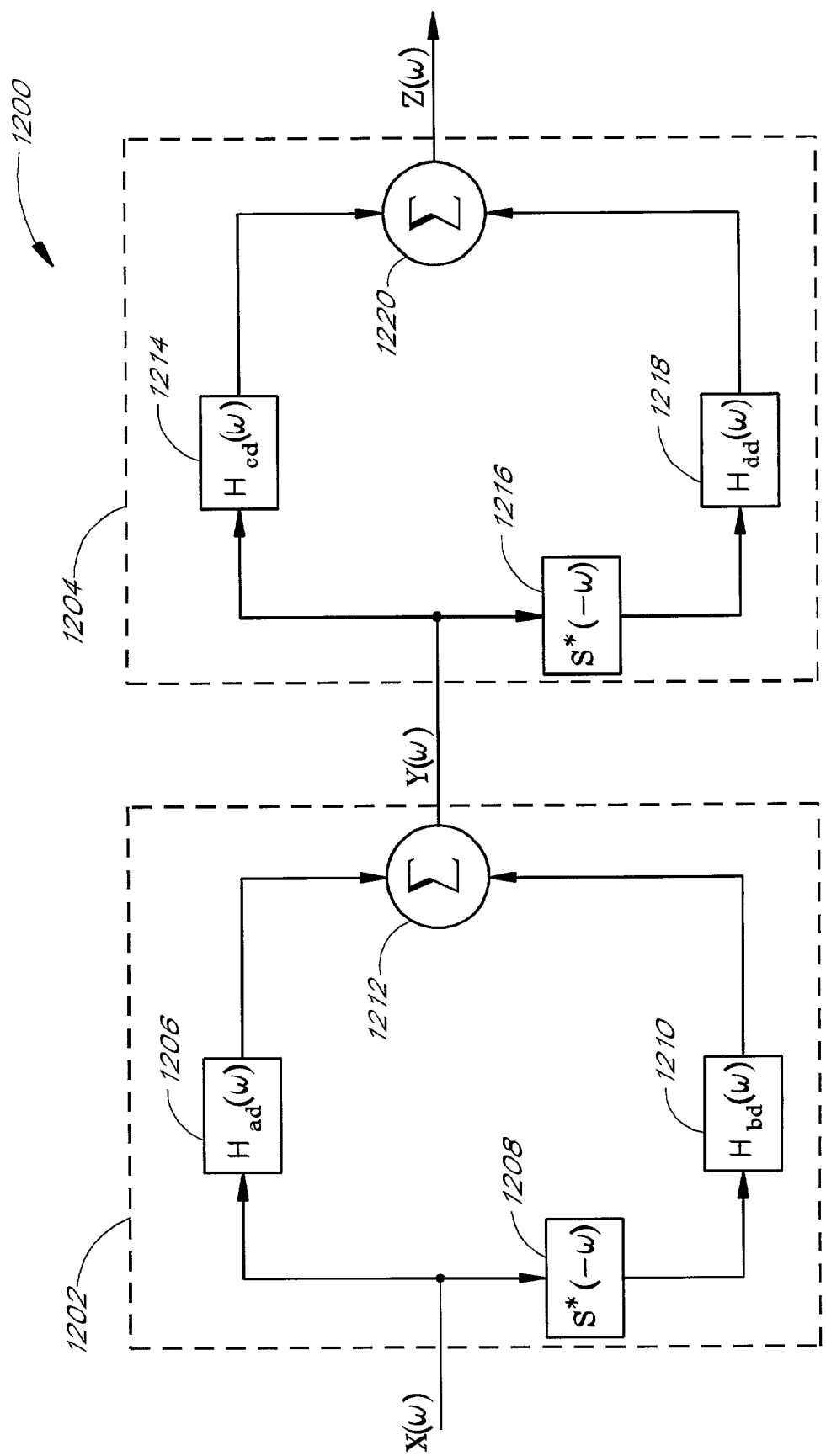
FIG. 12 is a frequency-domain block diagram of Quadrature Demodulation Impairment Pre-Compensation and Quadrature Demodulation Impairment.

FIG. 12 is a frequency-domain block diagram 1200 of Quadrature Demodulation Impairment 1202 introduced by the AQDS 110 and the corresponding Compensation 1204 in the QDCSP 112 for the Quadrature Demodulation Impairment 1202. The Quadrature Demodulation Impairment 1202 receives an input signal, labeled as X(ω). The Quadrature Demodulation Impairment 1202 produces an output, labeled as Y(ω), which is the sum 1212 of the product of X(ω) with a transfer function $H_{ad}(\omega)$ 1206 and the product of the complex conjugate S*(-ω) 1208 of X(ω) with a transfer function $H_{bd}(\omega)$ 1210.

The Compensation 1204 in the QDCSP 112 substantially negates the Quadrature Demodulation Impairment 1202 introduced by the AQDS 110 so that Z(ω) is substantially less impaired than Y(ω). The output of the Compensation 1204, Z(ω), is the sum 1220 of the product of Y(ω) with the transfer function $H_{cd}(\omega)$ 1214 and the product of the complex conjugate S*(-ω) 1216 of Y(ω) by transfer function $H_{dd}(\omega)$ 1218. Equation 11 describes the transformation from X(ω) to Z(ω).

$$Z(\omega)=X(\omega)\cdot[H_{ad}(\omega)\cdot H_{cd}(\omega)+H_{bd}*(-\omega)\cdot H_{dd}(\omega)] +X^*(-\omega)\cdot[H_{ad}*(-\omega)\cdot H_{dd}(\omega)+H_{bd}(\omega)\cdot H_{cd}(\omega)]$$

Eq. 11

The transfer functions $H_{ad}(\omega)$ 1206 and $H_{bd}(\omega)$ 1210 are obtained by characterizing the quadrature impairment of the AQDS 110 that is compensated. The filter coefficients of the QDCSP 112 are selected so that the transfer functions $H_{cd}(\omega)$ 1214 and $H_{dd}(\omega)$ 1218 satisfy or approximately satisfy Equation 12.

$$H_{ad}*(-\omega)\cdot H_{dd}(\omega)+H_{bd}(\omega)\cdot H_{cd}(\omega)=0$$

Eq. 12

Where the equality expressed in Equation 12 is reached or approximately reached, the compensation of the QDCSP 112 substantially reduces the quadrature impairment of the AQDS 110. Selection of the filter coefficients to satisfy Equation 12 is sufficient in many applications. However, the output signal Z(ω) may exhibit residual frequency dependent complex scaling and rotation relative to the input signal X(ω).

Where frequency dependent complex scaling and rotation are also compensated, the filter coefficients of the QDCSP 112 are also selected to satisfy or approximately satisfy Equation 13.

$$H_{ad}(\omega)\cdot H_{cd}(\omega)+H_{bd}*(-\omega)\cdot H_{dd}(\omega)=1$$

Eq. 13

As illustrated in Equation 13, computation of the transfer functions $H_{cd}(\omega)$ 1214 and $H_{dd}(\omega)$ 1218 in the frequency domain does not require the complicated task of computing convolutions. The transfer functions $H_{cd}(\omega)$ 1214 and $H_{dd}(\omega)$ 1218 can be computed for a relatively broad range of frequencies or for only the frequencies that are used by the AQMD system 100. For example, the ACPCE circuit 118 can characterize the quadrature impairment transfer function of the combination of the AQMS 104 and the AQDS 110 by monitoring selected frequency signals present in the input signals 122, 124 or by injection of appropriate test signals, such as digitally constructed frequency sweeps, through the test signals 180, 182, where such frequency sweeps are permitted by the application.

After the compensation transfer functions $H_{cd}(\omega)$ 1214 and $H_{dd}(\omega)$ 1218 are determined for the frequencies of interest, the corresponding compensation impulse responses $h_{cd}(t)$ 1114 and $h_{dd}(t)$ 1118 can be computed by, for example, computation of the inverse Fourier transform or inverse z-transform of $H_{cd}(\omega)$ 1214 and $H_{dd}(\omega)$ 1218, respectively. In one embodiment, the filter coefficients of the QDCSP 112 that implement the impulse responses $h_{cd}(t)$ 1114 and $h_{dd}(t)$ 1118 are selected to provide a white residual error and a minimum mean square error solution to the impulse responses. Equations 14 illustrate impulse responses $h_{iid}(t)$, $h_{qid}(t)$, $h_{iqd}(t)$, and $h_{qqd}(t)$ for the I-to-I compensation filter 1002, the Q-to-I compensation filter 1004, the I-to-Q compensation filter 1006, and the Q-to-Q compensation filter 1008, respectively, described in connection with FIG. 10:

$$h_{iid}(t)=Re[h_{cd}(t)+h_{dd}(t)]$$

$$h_{qid}(t)=Im[-h_{cd}(t)+h_{dd}(t)]$$

$$h_{iqd}(t) = Im[h_{cd}(t) + h_{dd}(t)]$$

$$h_{qqd}(t) = Re[h_{cd}(t) - h_{dd}(t)]$$  Eqs. 14

Figure 13:
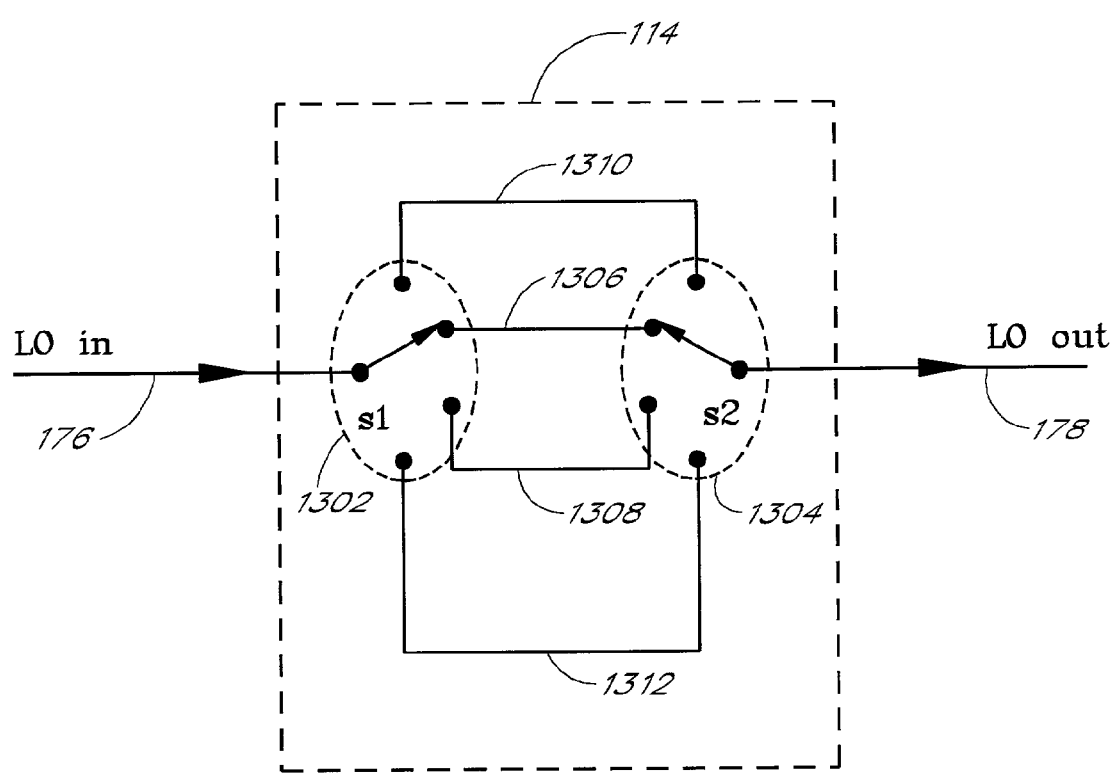
FIG. 13 illustrates one embodiment of a phase shifter according to the present invention.

FIG. 13 illustrates one embodiment of a phase shifter 114 according to the present invention. The phase shifter 114 advantageously enables the ACPCE circuit 118 to find a solution to the unknowns in the transfer function shown in Equation 15 so that the ACPCE circuit 118 can calculate the coefficients or parameters used by the QMCSP 102 and the QDCSP 112 to compensate for the quadrature impairment of the AQMS 104 and the AQDS 110. When the ACPCE 118 characterizes the system transfer function from the input signal 122, 124, $V_m(t)$, and the demodulated baseband signal 164, 166, $V_d(t)$, the characterization of the quadrature impairment from the digital compensated signals 126, 128, $V_s(\omega)$, and the received baseband signals 160, 162, $V_r(\omega)$, is described in Equation 15:

$$V_r(\omega) = V_s(\omega) \cdot [a(t) + jb(t)] + V_s^*(\omega) \cdot [c(t) + jd(t)] + K$$  Eq. 15

In Equation 15, j corresponds to the square root of negative one and K is the DC offset from $V_s(\omega)$ to $V_r(\omega)$. The impulse responses a(t), b(t), c(t), and d(t) are characterized by the ACPCE 118 as described below.

Preferably, the phase shifter 114 is located in the path between the LO 116 and the analog quadrature demodulator 150. However, in another embodiment, the phase shifter 114 is located in an alternative path such as the observation signal path 148 or the sample signal path 144.

The illustrated phase shifter 114 includes a first switch (s1) 1302, a second switch (s2) 1304, a first path 1306, a second path 1308, a third path 1310, and a fourth path 1312. In response to the control from the phase shifter control 174, the first switch receives the LO output 176 as an input and routes the LO output 176 to one of the paths 1306, 1308, 1310, 1312. The paths 1306, 1308, 1310, 1312 are of varying lengths, and hence, shift the phase of the phase shifted LO output 178 by varying the propagation delay of the signal. The second switch 1304 switches to the path selected by the first switch to receive and propagate the phase shifted LO output 178.

The switches 1302, 1304 can be implemented with a variety of electronic switches, such as RF switches. In one embodiment, the switches are Gallium Arsenide (GaAs) Field Effect Transistor (FET) Integrated Circuit single-pole, four throw non-reflective switches with relatively low insertion loss, with relatively high isolation, and which support a frequency range from direct current (DC) to the LO frequency. For example, the switches 1302, 1304 can comprise a pair of AK115-61 from Alpha Industries Inc. The paths 1306, 1308, 1310, 1312 can be implemented with signal traces on a printed circuit boards or by lengths of other conductors, such as wires. In one example, the lengths of the traces or other conductors range from about 2 centimeters (cm) to about 5 cm long. Preferably, the paths 1306, 1308, 1310, 1312 are designed in accordance with established RF design rules. Preferably, the variable phase shifter 114 maintains approximately the same magnitude for the phase shifted LO output 178 regardless of the path or phase delay selected. At relatively low frequencies, such as at IF, an IF Analog Quadrature Modulator can instead be used to shift phase.

Equation 15, which illustrates the overall transfer function from the digital compensated signals 126, 128, $V_s(\omega)$ and the received baseband signals 160, 162, $V_r(\omega)$, reveals that for a given phase, only four frequency-dependent parameters are readily observable by the ACPCE circuit 118. The four frequency-dependent parameters are the impulse responses a(t), b(t), c(t), and d(t) for the combination of the quadrature impairments introduced by both the AQMS 104 and the AQDS 110. However, to characterize the quadrature impairment introduced by the AQMS 104 and by the AQDS 110 independently, the impulse responses a(t), b(t), c(t), and d(t) are characterized for each of the AQMS 104 and the AQDS 110. Thus, there are 8 unknown parameters.

To solve for the unknowns, the AQMD system 100 advantageously shifts the phase of the variable phase shifter 114 to observe more parameters. Each phase shift of the variable phase shifter introduces an additional unknown corresponding to the relative phase differential between the applied phase shifter setting and the initial phase shifter setting, but enables ACPCE circuit 118 to observe four additional parameters. The table, below, illustrates the number of phases versus the number of unknown parameters and the number of observable parameters.

| No. of phases | No. of Unknowns | No. of Observations | Solvable? |
|---|---|---|---|
| 1 | 8 | 4 | no |
| 2 | 9 | 8 | no |
| 3 | 10 | 12 | yes |
| 4 | 11 | 16 | yes |
| 5 | 12 | 20 | yes |

As indicated in the table, above, the ACPCE circuit 118 shifts the variable phase shifter 114 to select at least 3 phase settings to solve for the unknowns. In one embodiment, the ACPCE circuit 118 shifts the variable phase shifter 114 to 3 phase settings. However, more than 3 phase selections, such as 4 or 5 phase selections can also be used. The variable phase shifter 114 shown in FIG. 13 is capable of providing 4 phase selections. In one embodiment, the ACPCE circuit 118 uses only 3 of the 4 phase selections available from the illustrated variable phase shifter 1114.

The amount of phase shift for the variable phase shifter 114 can conform to a variety of patterns and does not have to be evenly spaced between the paths. In one embodiment, the difference in phase shift between paths is approximately evenly spaced and conforms to about $$\frac{180°}{N}$$

between paths, where N is the number of selectable phase settings. For example, where N=3, the paths exhibit approximately 60 degrees of phase shift at LO frequency. Preferably, the phase shift is controlled to within ±5 degrees. Preferably, the variable phase shifter 114 can repeat the amount of phase shift to within about 1 or 2 degrees.

In general, the variable phase shifter 114 can be constructed from a variety of discrete or integrated RF components that delay or advance the phase of the signal or act on the LO itself to adjust the relative phase of the LO signals to the AQMS 104 and AQDS 110. In one embodiment, the variable phase shifter 114 is constructed from an analog quadrature modulator that electrically shifts the phase of the local oscillator signal. In another embodiment, the variable phase shifter 114 is constructed from electro-mechanical devices, such as a servo-controlled trombone, which physically varies a path length and thereby alters the propagation path of the local oscillator signal.

In addition, the skilled practitioner will recognize that either phase rotation of the LO or phase rotation of the observation signal 148 to the AQDS 110 is sufficient to allow the identification of AQMS 104 and AQDS 110 quadrature impairments. However, a phase rotation can introduce an amplitude variation. Because a typical AQDS 110 is relatively less sensitive to amplitude variation at a LO input than at the observation signal 148 input, phase rotation at the LO input is preferred.

Figure 14:
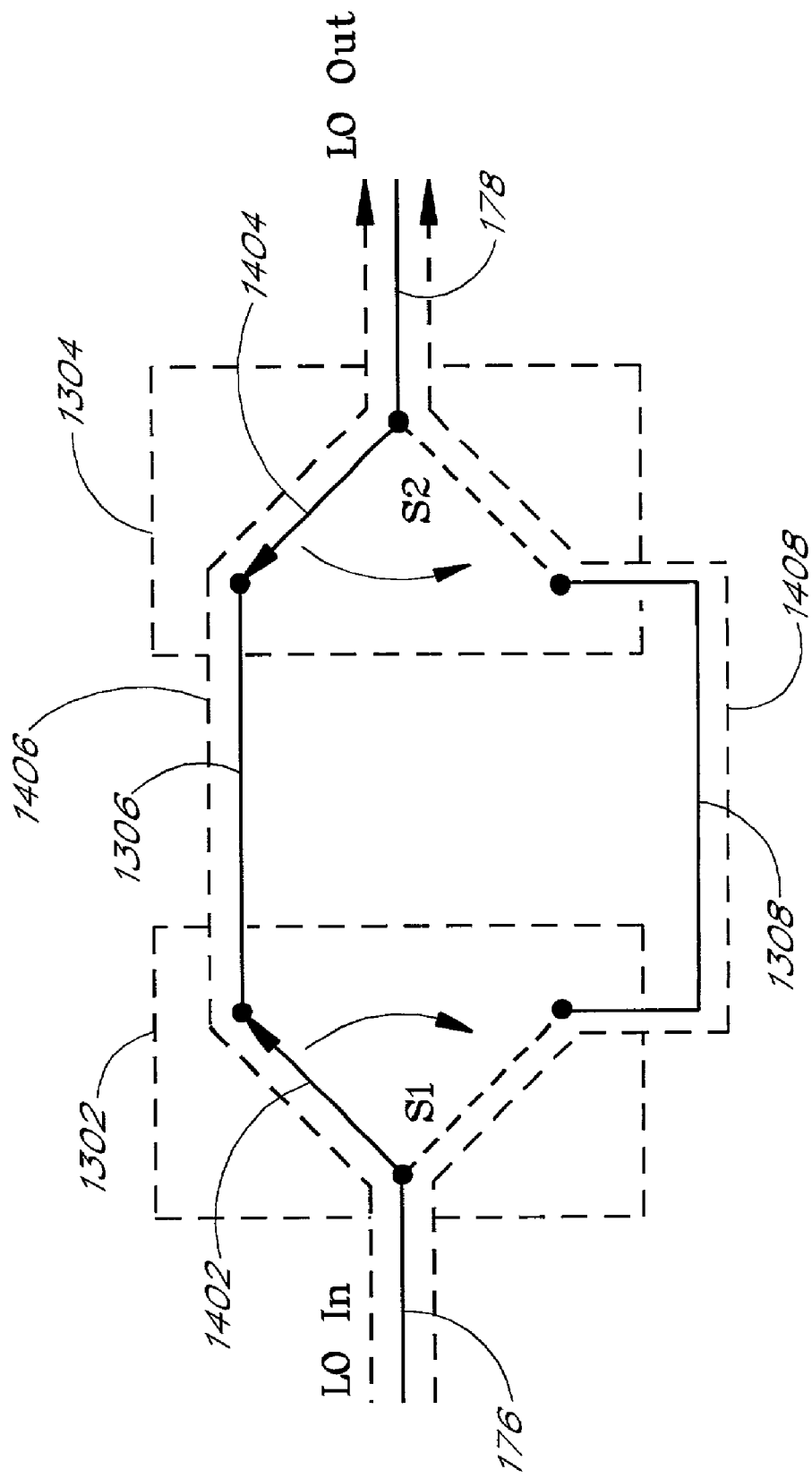
FIG. 14 illustrates signal leakage characteristics of a portion of the phase shifter.

FIG. 14 illustrates signal leakage characteristics of a portion of the phase shifter 114. In a first position, the first and the second switches 1302, 1304 select the first path 1306. Most of the input signal to the phase shifter 114, the LO signal 176 from the local oscillator 116 follows the first path 1306 as indicated by dashed line 1406. However, a relatively small amount of the input signal to the phase shifter 114 leaks through other paths, such as the second path 1308, which is indicated by dashed line 1408, even when the second path 1308 is not selected. Sources for signal leakage include leakage through switches and coupling across conductors. For example, a typical RF switch can provide about 25–30 dB of isolation in the "off" state, so that each path with two switches provides about 50–60 dB of isolation. The leakage, though relatively small, can result in varying DC offsets from the AQDS 110 for the phase shifter settings. In one embodiment, the ACPCE circuit 118 activates the ground switch control 172 for each phase shifter setting to characterize and compensate for the DC offset for different phase shifter settings.

Figure 15:
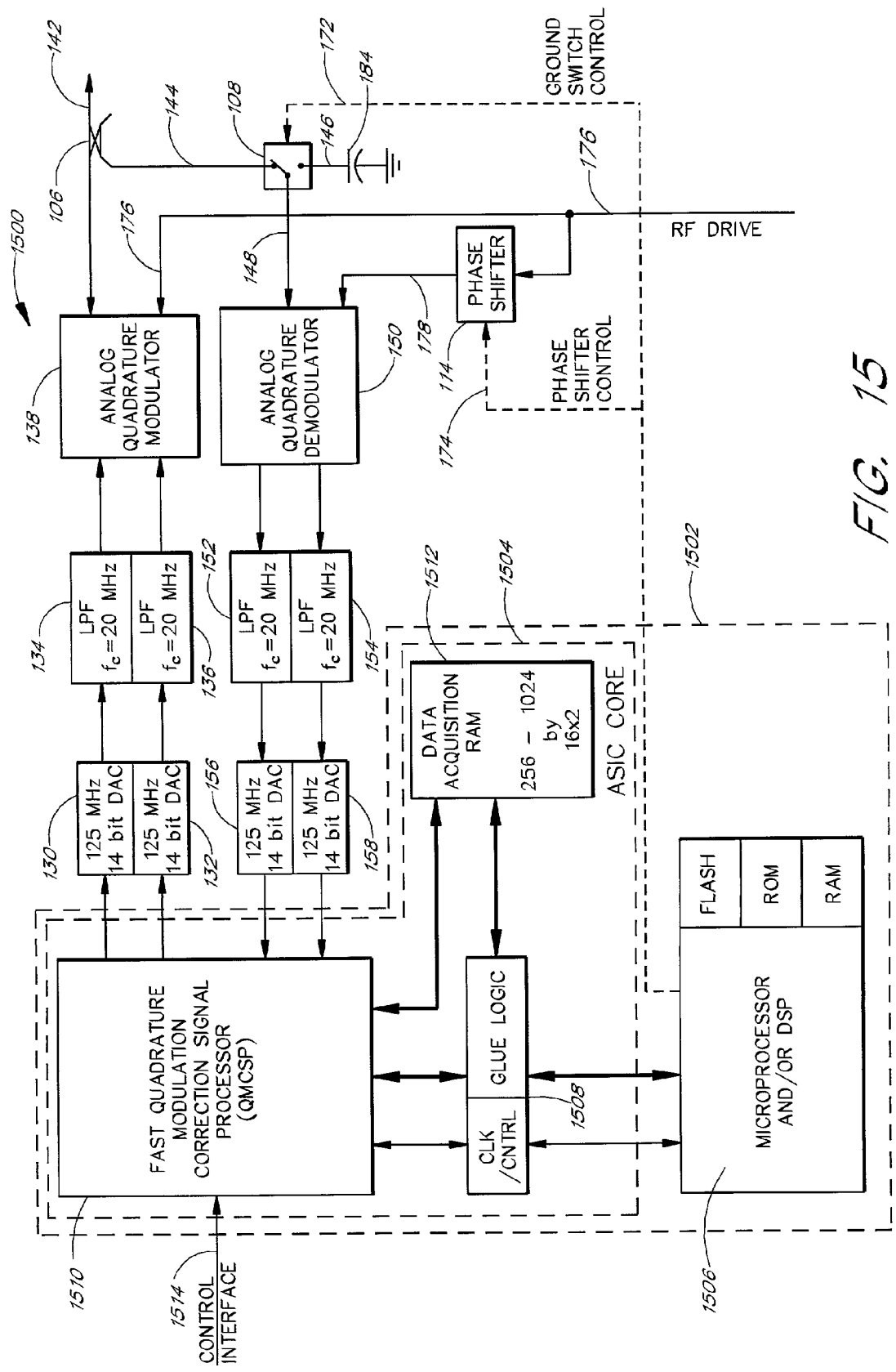
FIG. 15 illustrates an Analog Quadrature Modulator/Demodulator System according to the present invention.

FIG. 15 illustrates an analog quadrature modulator/demodulator system 1500 according to the present invention. A quadrature impairment compensation system 1502 includes an ASIC core 1504 and a microprocessor 1506. The quadrature impairment compensation system 1502 includes a control interface 1508, a quadrature modulation correction signal processor (QMCSP) 1510 and a data acquisition RAM 1512. The block labeled QMCSP 1510 includes the quadrature impairment correction for the modulation path.

The QMCSP 1510 receives the control interface 1514, which includes the data to be quadrature modulated, and processes the data to compensate for quadrature impairment in the digital-to-analog converters 130, 132, the reconstruction filters 134, 136, and the analog quadrature modulator 138. The QMCSP 1510 compensates for quadrature impairment in real time. In a typical telecommunications application, such as W-CDMA, the QMCSP 1510 processes signals at a relatively fast rate. In one embodiment, the signal processing in the QMCSP 1510 is performed by dedicated hardware such as a field programmable gate array (FPGA), such as an FPGA or other programmable logic device, which are available from sources such as Xilinx, Inc. or Altera Corporation. In one embodiment, the QMCSP 1510 is implemented within an application specific integrated circuit (ASIC).

The data acquisition RAM 1512 stores the sampled data, which can be sampled in relatively short bursts. The data is accessed through the control interface 1508 by the microprocessor 1506 to allow the microprocessor 1506 to characterize the quadrature impairment and to calculate the appropriate compensation parameters or coefficients. The data acquisition RAM 1512 can also maintain the compensation parameters or coefficients that are used by the QMCSP to compensate for the quadrature impairment. In one embodiment, the control interface 1508, the QMCSP 1510, and the data acquisition RAM 1512 reside in a single ASIC. In addition, in a relatively low performance application where data rates are sufficiently low, the QMCSP 1510 can be implemented by a digital signal processor (DSP), such as a TMS320C60 from Texas Instruments Incorporated or a SHARC processor from Analog Devices, Inc.

The microprocessor 1506 can operate in non-real time and can thereby be implemented by a general purpose DSP or microprocessor such as a TMS320C54, TMS320C60, or TMS320C40 from Texas Instruments Incorporated, or the 68000 series from Motorola, Inc. In one embodiment, the correction of the quadrature impairment introduced by the analog quadrature demodulator 150, the anti-alias filters 152, 154, and the analog-to-digital converters 156, 158 is performed in non-real time by the microprocessor 1506. Of course, the microprocessor 1506 can include internal or external memory, such as Flash PROMS, EEPROM, EPROM, ROM, RAM and the like, for program storage and for storage of initial calibration data, such as compensation parameters taken during manufacture of the analog quadrature modulator/demodulator system 1500.

In addition, a microprocessor core or a DSP core can be embedded within the same ASIC used to implement the control interface 1508, the QMCSP 1510, and the data acquisition RAM 1512. Examples of licensable cores include the ARM7 from Advanced RISC Machines, Ltd., the Teak from DSP Group Inc., the Oak from DSP Group Inc., and the ARC from ARC Cores.

In the illustrated embodiment, the microprocessor 1506 also controls the termination switch 108 and the phase shifter 114 through the ground switch control 172 and the phase shifter control 174, respectively. The analog quadrature modulator/demodulator system 1500 shown in FIG. 15 also illustrates a direct baseband to RF up-conversion using the analog quadrature modulator 138 and a direct RF to baseband down-conversion using the analog quadrature demodulator 150. Of course, the analog quadrature modulator/demodulator system 1500 can also modulate to an IF and perform the upconversion and the downconversion processes in a separate stage.

Figure 16:
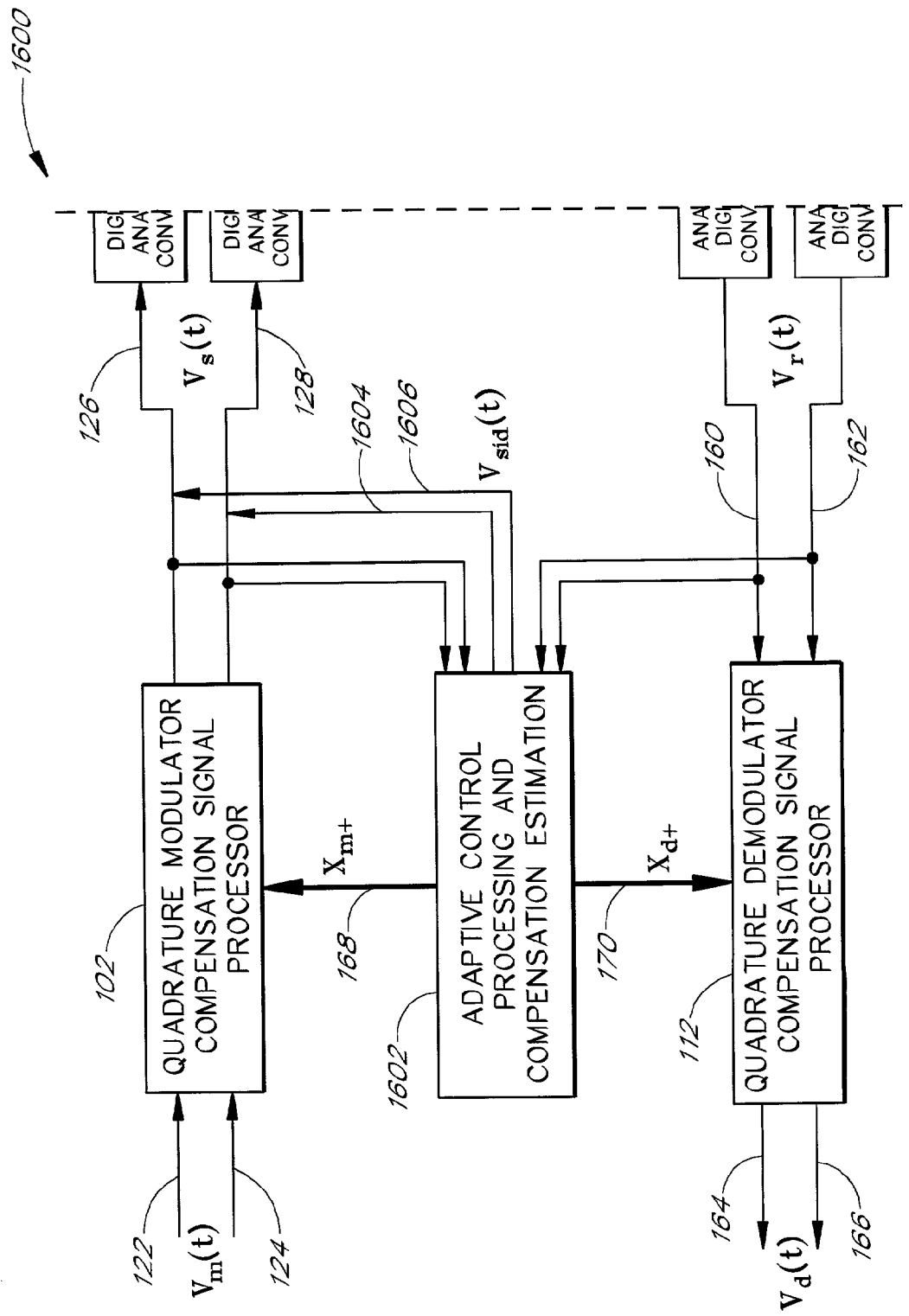
FIG. 16 illustrates an alternative embodiment of a portion of the Analog Quadrature Modulator/Demodulator System according to the present invention.

FIG. 16 illustrates an alternative embodiment 1600 of a portion of the Analog Quadrature Modulator/Demodulator System 100 according to the present invention. In the alternative embodiment 1600 shown in FIG. 16, the ACPCE monitors the digital compensated signal 126, 128 rather than the input signal 122, 124, the ACPCE monitors the received baseband signals 160, 162 rather than the demodulated baseband signals 164, 166, and injects test signals to the inputs of the AQMS 104 rather than through the inputs of the QMCSP 102. Of course, combinations of the features from the embodiments shown in FIGS. 1 and 16 are also possible.

One advantage of the embodiment shown in FIG. 1 is that the observation of the impairment characteristics from pre-compensation by the QMCSP 102 and post-compensation by the QDCSP 112, enables the ACPCE circuit 118 to compute the compensation parameters or coefficients in a closed-loop fashion. Although the ACPCE 1602 of FIG. 16 computes compensation parameters or coefficients in an open-loop fashion, the configuration shown in FIG. 16 offers an alternative that, in particular applications, may prove more practical to implement.

In another embodiment, where the AQDS 110, the QDCSP 112, the variable phase shifter 114, and the termination switch 108 are not necessarily present, conventional envelope detectors, such as diode detectors, detect the quadrature impairment at selected frequencies with the use of test tones. The ACPCE 1602 collects the samples of detected RF or IF, characterizes the AQMS 104 quadrature impairment, and computes compensation coefficients and parameters for the QMCSP 102 as previously described.

Another embodiment employs a digital quadrature demodulator in place of the AQDS 110, the QDCSP 112, the variable phase shifter 114, and the termination switch 108. The digital quadrature demodulator demodulates the observation signal with a relatively low amount of quadrature impairment, thereby allowing a controlling circuit, such as the ACPCE circuit 118, to effectively observe the quadrature impairments due to the AQMS 104 by monitoring the demodulated outputs of the digital quadrature demodulator.

In some applications, such as in a cellular base station modulator/transmitter, the modulator/transmitter alternately transmits signals in the forward path to mobile devices and alternately receives signals from the mobile devices in the reverse path. This process is also known as "time duplexing." In one embodiment, the AQDS 110 used to characterize quadrature impairment is also advantageously used to demodulate and/or downconvert the signals in the reverse path. Of course, where the AQDS 110 is also used to demodulate and/or downconvert the signals in the reverse path, the modulator/transmitter can further include components typical of a receiver front-end, such as a low-noise amplifier (LNA).

Figure 17:
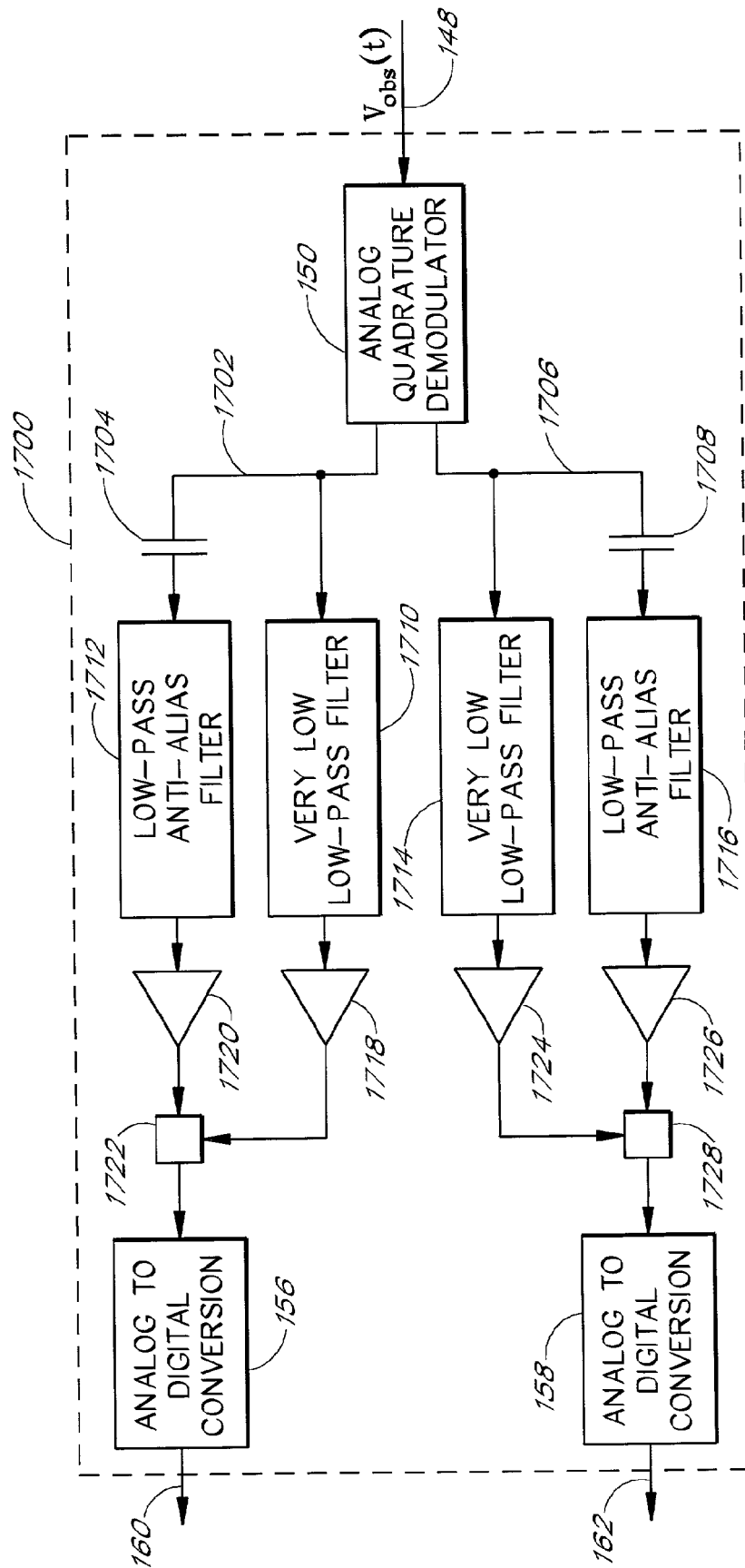
FIG. 17 illustrates an alternative embodiment of an Analog Quadrature Demodulator System.

FIG. 17 illustrates an alternative embodiment of an Analog Quadrature Demodulator System (AQDS) 1700 adapted to demodulate relatively wide-band signals. The AQDS 1700 shown in FIG. 17 includes the analog quadrature demodulator 150, a first high pass filter 1704, a second high pass filter 1708, a first very low low-pass filter 1710, a first anti-alias filter 1712, a second very low low-pass filter 1714, a second anti-alias filter 1716, a first low-frequency signal amplifier 1718, a first high frequency signal amplifier 1720, a first junction 1722, a second low-frequency signal amplifier 1724, a second high frequency signal amplifier 1726, a second junction 1728, the first analog-to-digital converter 156, and the second analog-to-digital converter 158.

Where the bandwidth of the observation signal 148 is relatively wide, and particularly where the bandwidth includes DC, one limitation on the performance of the AQDS 1700 can be caused by the performance of the signal amplifiers. Although low frequency signals are relatively simple to amplify, amplification of a low frequency signal, such as a DC offset, can have a deleterious effect on the performance of the signal amplifier at higher frequencies, i.e., can reduce the gain-bandwidth product of the amplifier. The illustrated AQDS 1700 advantageously includes AC coupling by the first and the second high-pass filters 1704, 1708 to decrease the amount of low frequency signals amplified by the first and the second high-frequency signal amplifiers 1720, 1726 and thereby maintain the desired high-frequency performance of the amplifiers 1720, 1726. In one embodiment, the first and the second high-pass filters 1704, 1708 are capacitors.

To maintain observation of impairments such as DC offsets, the illustrated AQDS 1700 includes a relatively low frequency path to couple the low frequency signals to the analog-to-digital converters 156, 158. Relatively low frequency signals in the first and the second demodulation paths 1702, 1704 pass through the relatively low frequency low-pass filters 1710, 1716 and are amplified by the first and the second low-frequency signal amplifiers 1718, 1724, respectively.

The first and the second junctions 1722, 1728 provide the outputs of the first low-frequency signal amplifier 1718, the first high-frequency signal amplifier 1720, and the second low-frequency signal amplifier 1724, the second high-frequency signal amplifier 1726, respectively, as inputs to the analog-to-digital converters 156, 158. The first and the second junctions 1722, 1728 can combine the relatively low frequency signals and the relatively high frequency signals using standard summing or combining circuits, or can switch between the relatively low frequency signals and the relatively high frequency signals. Many variations for maintaining the high frequency performance of the first and the second high-frequency signal amplifiers 1720, 1726 and retaining the ability to measure DC offsets exist. For example, in another embodiment, the AQDS 1700 can instead include bypass switches, which allow relatively low-frequency signals, such as DC, to bypass the first and the second high pass filters 1704, 1708 upon activation of the bypass switches by the ACPCE circuit 118 to allow the ACPCE circuit 118 to measure the DC offsets.

Figure 18:
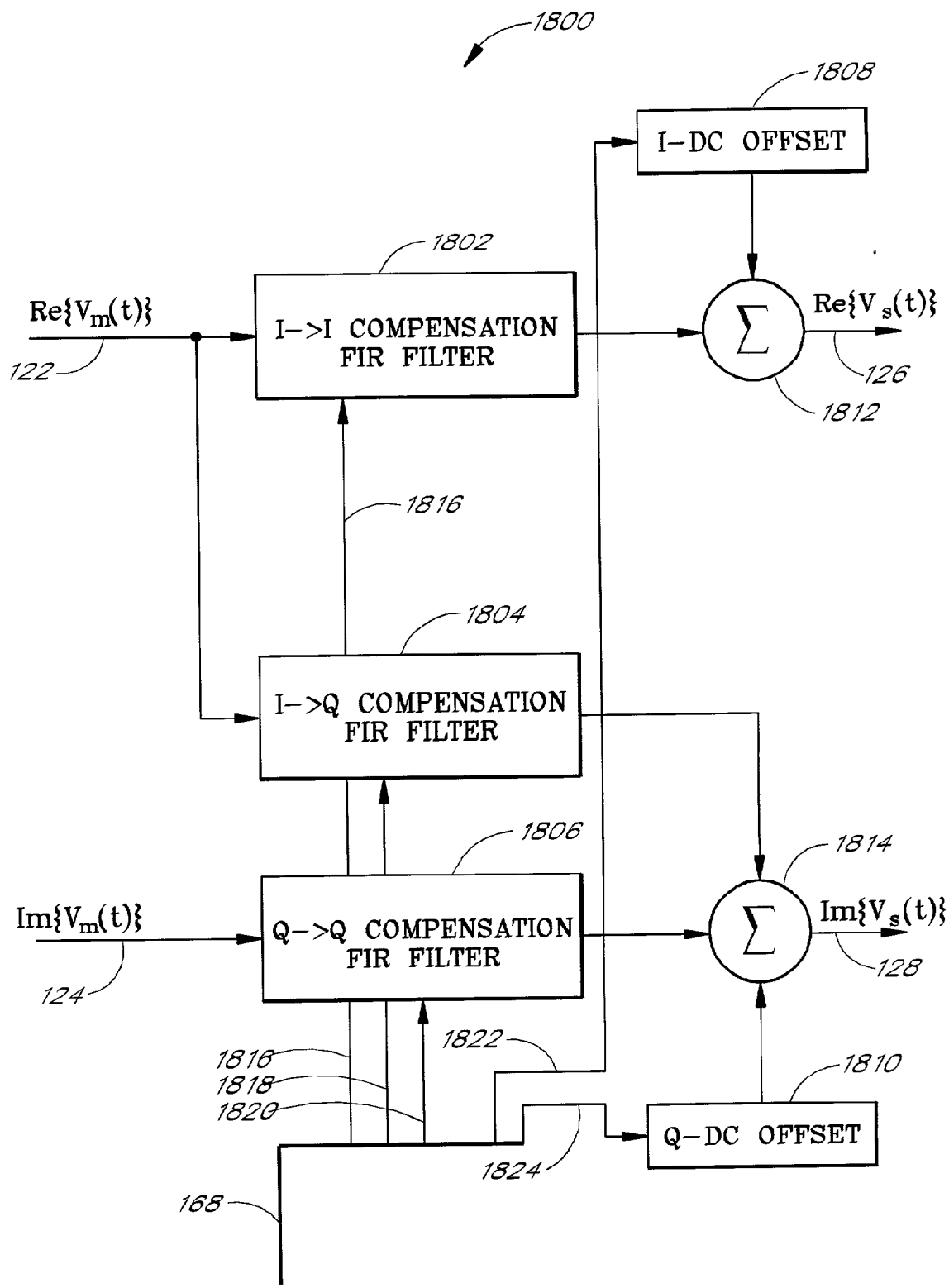
FIG. 18 is a block diagram of an alternative embodiment of a Quadrature Modulator Compensation Signal Processor.

FIG. 18 is a block diagram of an alternative embodiment of a Quadrature Modulator Compensation Signal Processor (QMCSP) 1800. The QMCSP 1800 pre-distorts the input signals 122, 124 to negate the quadrature impairment introduced by a downstream AQMS 104. In contrast to the four-filter configuration described in connection with FIG. 6, the illustrated QMCSP 1800 uses a three-filter configuration. As described in connection with FIG. 6, one of the I-to-Q compensation filter or the Q-to-I compensation filter can be removed and still compensate for quadrature impairment. However, such compensation with a three-filter configuration can result in a frequency dependent complex scaling and rotation of the digital compensated signals 126, 128.

To illustrate such removal of a filter, the Q-to-I compensation filter is removed from the embodiment of the QMCSP 1800 shown in FIG. 18. In another embodiment, the I-to-Q compensation filter is removed instead. Such removal of a filter can be accomplished by deletion of the filter from the QMCSP 1800, or by a setting of filter coefficients to zero. The QMCSP 1800 includes an I-to-I compensation filter 1802, an I-to-Q compensation filter 1804, a Q-to-Q compensation filter 1806, an in-phase DC offset register 1808, a quadrature-phase DC offset register 1810, an in-phase adder 1812, and a quadrature-phase adder 1814. The compensation filters 1802, 1804, 1806 process the input signals 122, 124 to negate the gain and phase imbalance of the AQMS 104. The DC offset registers 1808, 1810 negate the DC offset of the AQMS 104.

The I-to-I compensation filter 1802 receives filter coefficients from the ACPCE circuit 118 from the modulator state parameter update vector 168 through update vector 1816 to process the in-phase portion of the input signal 122. The I-to-Q compensation filter 1804 receives filter coefficients through update vector 1818 of the modulator state parameter update vector 168 to process the in-phase portion of the input signal 122. The Q-to-Q compensation filter 1806 receives filter coefficients through update vector 1820 of the modulator state parameter update vector 168 to process the quadrature-phase portion of the input signal 124. The in-phase DC offset register 1808 and the quadrature-phase DC offset register 1810 receive DC offset values from the update vectors 1822, 1824, respectively, that negate the DC offset of the AQMS 104.

The in-phase adder 1812 combines the output of the I-to-I compensation filter 1802 with the output of the in-phase DC offset register 1808 to generate the in-phase portion of the digital compensated signal 126. The quadrature-phase adder 1814 combines the outputs of the I-to-Q compensation filter 1804, the Q-to-Q compensation filter 1806, and the quadrature-phase DC offset register 1810 to generate the quadrature-phase portion of the digital compensated signal 128.

Preferably, the compensation filters 1802, 1804, 1806 are finite impulse response (FIR) filters. Preferably, the tap lengths of the compensation filters are equal. In other embodiments, the compensation filters 1802, 1804, 1806 are infinite impulse response filters, Lattice filters, and the like.

As described in connection with FIG. 8, the filter coefficients of the QMCSP 1800 are selected so that the impulse responses $h_{cm}(t)$ 806 and $h_{dm}(t)$ 810 satisfy or approximately satisfy Equation 2.

Where the equality expressed in Equation 2 is reached or approximately reached, the compensation of the QMCSP 1800 substantially reduces the quadrature impairment of the AQMS 104. The impulse responses $h_{cm}(t)$ 806 and $h_{dm}(t)$ 810 are implemented in the compensation filters 1802, 1804, 1806 in accordance with Equations 16, where $h_{iim}(t)$, $h_{iqm}(t)$, and $h_{qqm}(t)$ are the impulse responses for the I-to-I compensation filter 1802, the I-to-Q compensation filter 1804, and the Q-to-Q compensation filter 1806, respectively.

$$h_{iim}(t)=Re[h_{cm}(t)+h_{dm}(t)]$$

$$h_{iqm}(t)=Im[h_{cm}(t)+h_{dm}(t)]$$

$$h_{qqm}(t)=Re[h_{cm}(t)-h_{dm}(t)]$$

$$h_{qim}(t)=Im[-h_{cm}(t)+h_{dm}(t)]=0 \qquad \text{Eqs. 16}$$

In another embodiment, where the I-to-Q compensation filter is removed instead of the Q-to-I compensation filter, the remaining I-to-I compensation filter, the Q-to-I compensation filter, and the Q-to-Q compensation filter, implement the impulse responses $h_{cm}(t)$ 806 and $h_{dm}(t)$ 810 with impulse responses $h_{iim}(t)$, $h_{qim}(t)$, and $h_{qqm}(t)$ in accordance with Equations 17:

$$h_{iim}(t)=Re[h_{cm}(t)+h_{dm}(t)]$$

$$h_{qim}(t)=Im[-h_{cm}(t)+h_{dm}(t)]$$

$$h_{qqm}(t)=Re[h_{cm}(t)-h_{dm}(t)]$$

$$h_{iqm}(t)=Im[h_{cm}(t)+h_{dm}(t)]=0 \qquad \text{Eqs. 17}$$

Figure 19:
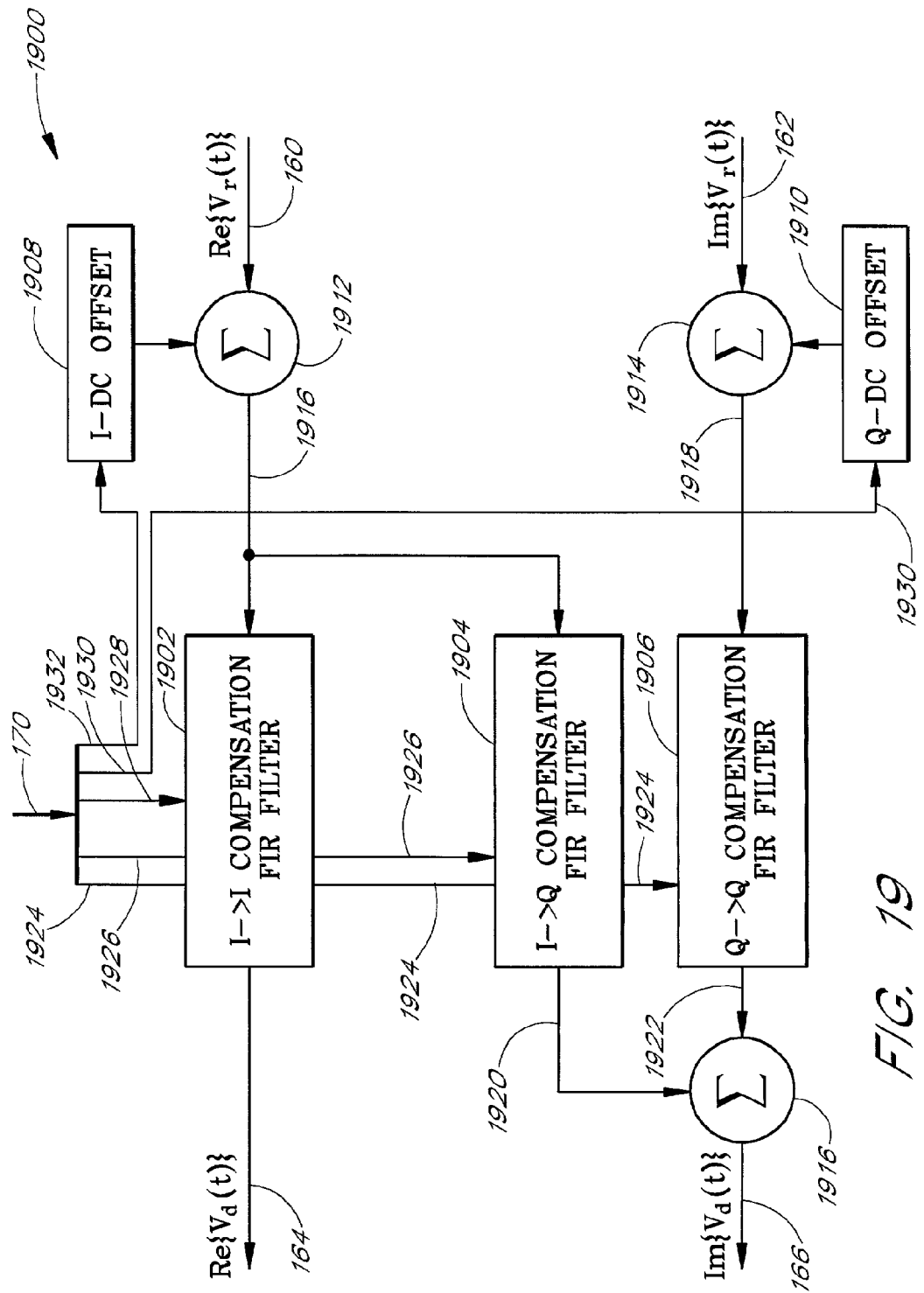
FIG. 19 is a block diagram of an alternative embodiment of a Quadrature Demodulator Compensation Signal Processor.

FIG. 19 is a block diagram of an alternative embodiment of a Quadrature Demodulator Compensation Signal Processor (QDCSP) 1900. In contrast to the four-filter configuration described in connection with FIG. 10, the illustrated QDCSP 1900 uses a three-filter configuration to negate the quadrature impairment introduced by the AQDS 110. Although a three-filter configuration can compensate for quadrature impairment, such compensation can result in a frequency dependent complex scaling and rotation of the demodulated baseband signals 164, 166. The QDCSP 1900 can be implemented in real time or non-real time by hardware or firmware. In one embodiment, the QDCSP 1900 is implemented by firmware executing in a microprocessor or a general purpose digital signal processor.

Again, either of the I-to-Q compensation filter or the Q-to-I compensation filter can be removed from the Quadrature Demodulator Compensation Signal Processor. One embodiment removes the omitted filter by not executing the routine that would implement the filter in firmware. The illustrated embodiment of the QDCSP 1900 omits the Q-to-I compensation filter from the demodulation compensation.

The QDCSP 1900 includes an I-to-I compensation filter 1902, an I-to-Q compensation filter 1904, a Q-to-Q compensation filter 1906, an in-phase DC offset register 1908, a quadrature phase DC offset register 1910 an in-phase adder 1912, a first quadrature-phase adder 1914, and a second quadrature-phase adder 1916. The ACPCE circuit 118 provides coefficients and values to the compensation filters 1902, 1904, 1906 and the offset registers 1908, 1910 through update vectors 1924, 1926, 1928, 1930, 1932 of the demodulator state parameter update vector 170, respectively.

The in-phase adder 1912 sums the in-phase portion of the received baseband signal 160 with the value stored in the in-phase DC offset register 1908, and applies the summation as an input to the I-to-I compensation filter 1902 and to the I-to-Q compensation filter 1904. The I-to-I compensation filter 1902 generates the in-phase portion of the demodulated baseband signal 164 as an output.

The first quadrature-phase adder 1914 sums the quadrature-phase portion of the received baseband signal 162 with the value stored in the quadrature-phase DC offset register 1910, and applies the summation as an input to the Q-to-Q compensation filter 1906. The outputs of the I-to-Q compensation filter 1904 and the Q-to-Q compensation filter 1906 are summed by the second quadrature-phase adder 1916 to generate the quadrature phase of the demodulated baseband signal 166. Of course, where implemented by firmware, the demodulated baseband signals 164, 166 can be maintained within a memory device accessed by the firmware.

Preferably, the compensation filters 1902, 1904, 1906 are finite impulse response (FIR) filters. Preferably, the tap lengths of the compensation filters are equal. In other embodiments, the compensation filters 1902, 1904, 1906 are infinite impulse response filters, Lattice filters, and the like.

As described in connection with FIG. 11, the filter coefficients of the QDCSP 1900 are selected so that the impulse responses $h_{cd}(t)$ 1114 and $h_{dd}(t)$ 1118 satisfy or approximately satisfy Equation 8.

Where the equality expressed in Equation 8 is reached or approximately reached, the compensation of the QDCSP 1900 substantially reduces the quadrature impairment of the AQDS 110. The impulse responses $h_{cd}(t)$ 1114 and $h_{dd}(t)$ 1118 are implemented in the compensation filters 1902, 1904, 1906 in accordance with Equations 18, where $h_{iid}(t)$, $h_{iqd}(t)$, and $h_{qqd}(t)$ are the impulse responses for the I-to-I compensation filter 1902, the I-to-Q compensation filter 1904, and the Q-to-Q compensation filter 1906, respectively.

$$h_{iid}(t)=Re[h_{cd}(t)+h_{dd}(t)]$$

$$h_{iqd}(t)=Im[h_{cd}(t)+h_{dd}(t)]$$

$$h_{qqd}(t)=Re[h_{cd}(t)-h_{dd}(t)]$$

$$h_{qid}(t)=Im[-h_{cd}(t)+h_{dd}(t)]=0 \qquad \text{Eqs. 18}$$

In another embodiment, where the I-to-Q compensation filter is removed instead of the Q-to-I compensation filter, the remaining I-to-I compensation filter, the Q-to-I compensation filter, and the Q-to-Q compensation filter, implement the impulse responses $h_{cd}(t)$ 1114 and $h_{dd}(t)$ 1118 with impulse responses $h_{iid}(t)$, $h_{qid}(t)$, and $h_{qqd}(t)$ in accordance with Equations 19:

$$h_{iid}(t)=Re[h_{cd}(t)+h_{dd}(t)]$$

$$h_{qid}(t)=Im[-h_{cd}(t)+h_{dd}(t)]$$

$$h_{qqd}(t)=Re[h_{cd}(t)-h_{dd}(t)]$$

$$h_{iqd}(t)=Im[h_{cd}(t)+h_{dd}(t)] \qquad \text{Eqs. 19}$$

In addition to telecommunications applications, embodiments of the present invention can also compensate for quadrature impairment in other applications, such as point-to-point, point-to-multipoint, wireless local loop, Multi- Channel Multipoint Distribution System (MMDS), and Local Multipoint Distribution System (LMDS) wireless systems.

Embodiments of the present invention can also be advantageously used in connection with existing cellular systems. For example, the techniques for quadrature impairment compensation disclosed herein can reduce the cost of quadrature modulator systems by enabling relatively low-cost analog quadrature modulators to be used in relatively demanding applications. The techniques can also apply relatively broadly to the satellite, cable broadcast and terrestrial broadcast industries, where transmission and/or reception of wide-band or multiple narrow-band signals is desirable. Such signals typically include digital radio and digital television signals, which generally demand quadrature modulation with relatively low quadrature impairment.

Other applications for embodiments of the present invention include relatively high precision test equipment, such as vector signal analyzers or multi-channel signal generators for W-CDMA, IMT-2000 and UMTS-2000, which typically require relatively accurate and/or wide bandwidth quadrature modulation and/or demodulation.

Embodiments of the present invention provide quadrature modulators and/or demodulators with quadrature impairment compensation for relatively wide-band signals. The quadrature impairment compensation includes compensation for quadrature impairments that vary across the frequency band, i.e., are frequency dependent, thereby permitting the quadrature modulators and/or demodulators to modulate a relatively broad range of baseband signals.

Various embodiments of the present invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

What is claimed is:

1. An apparatus that receives a digital baseband signal and modulates the digital baseband signal to a quadrature modulated output signal, the apparatus comprising:

a quadrature modulator compensation signal processor (QMCSP) adapted to receive the digital baseband signal, where the QMCSP includes a first digital filter to generate a digital compensated signal so that the digital compensated signal negates at least a portion of a quadrature impairment in an analog quadrature modulator system (AQMS) for a plurality of baseband frequencies;

the AQMS, where the AQMS is adapted to receive the digital compensated signal and a local oscillator signal, where the AQMS is further adapted to quadrature modulate, in analog domain, the digital compensated signal to the quadrature modulated output signal;

a termination switch adapted to provide an observation signal, where the termination switch is coupled to a sample signal related to the quadrature modulated output signal and coupled to a source for a ground signal, where the termination switch further switches between the sample signal and the source for the ground signal in response to a ground switch control signal;

a variable phase shifter adapted to receive the local oscillator signal and to provide a phase shifted output signal, where the phase shifted output signal is selectable to at least 3 phase shifts, and where a phase shift is selected in response to a phase shifter control signal;

an analog quadrature demodulator system (AQDS) adapted to receive the observation signal and the phase shifted output signal, the AQDS adapted to demodulate the observation signal and to recover a received baseband signal that is related to the baseband signal, and where the received baseband signal includes quadrature impairment;

a quadrature demodulator compensation signal processor (QDCSP) adapted to receive the received baseband signal from the AQDS, where the QDCSP includes a second digital filter to generate a demodulated baseband signal such that at least a portion of the quadrature impairment added to the received baseband signal by the AQDS is compensated in the demodulated baseband signal for a plurality of frequencies; and an adaptive control processing and compensation estimation (ACPCE) circuit adapted to monitor the baseband signal and the received baseband signal, where the ACPCE circuit is further adapted to update parameters used by the QMCSP and the QDCSP to compensate for quadrature impairment.

2. The apparatus as defined in claim 1, wherein the first digital filter of the QMCSP further comprises:

a first finite impulse response (FIR) filter adapted to receive an in-phase portion of the baseband signal and to generate a first in-phase portion of the digital compensated signal;

a second FIR filter adapted to receive a quadrature-phase portion of the baseband signal and to generate a second in-phase portion of the digital compensated signal;

a third FIR filter adapted to receive an in-phase portion of the baseband signal and to generate a first quadrature-phase portion of the digital compensated signal;

a fourth FIR filter adapted to receive a quadrature-phase portion of the baseband signal and to generate a second quadrature-phase portion of the digital compensated signal;

a first sunning circuit adapted to combine the first in-phase portion of the digital compensated signal with the second in-phase portion of the digital compensated signal to generate an in-phase digital compensated signal; and a second summing circuit adapted to combine the first quadrature-phase portion of the digital compensated signal with the second quadrature-phase portion of the digital compensated signal to generate a quadrature-phase digital compensated signal, where the in-phase digital compensated signal and the quadrature-phase digital compensated signal comprise the digital compensated signal.

3. The apparatus as defined in claim 2, wherein the first digital filter of the QMCSP further comprises:

a first register adapted to store a first value, and where the first summing circuit is further configured to combine the first value with the first and the second in-phase portions of the digital compensated signal to generate the in-phase portion of the digital compensated signal; and a second register adapted to store a second value, and where the second summing circuit is further configured to combine the second value with the first and the second quadrature-phase portions of the digital compensated signal to generate the quadrature phase portion of the digital compensated signal.

4. The apparatus as defined in claim 1, wherein the first digital filter of the QMCSP further comprises:
- a first finite impulse response (FIR) filter adapted to receive an in-phase portion of the baseband signal and to generate an in-phase digital compensated signal;
- a second FIR filter adapted to receive an in-phase portion of the baseband signal and to generate a first quadrature-phase portion of the digital compensated signal;
- a third FIR filter adapted to receive a quadrature-phase portion of the baseband signal and to generate a second quadrature-phase portion of the digital compensated signal; and
- a summing circuit adapted to combine the first quadrature-phase portion of the digital compensated signal with the second quadrature-phase portion of the digital compensated signal to generate a quadrature-phase digital compensated signal, where the in-phase digital compensated signal and the quadrature-phase digital compensated signal comprise the digital compensated signal.

5. The apparatus as defined in claim 1, wherein the first digital filter of the QMCSP further comprises:
- a first finite impulse response (FIR) filter adapted to receive an in-phase portion of the baseband signal and to generate a first in-phase portion of the digital compensated signal;
- a second FIR filter adapted to receive a quadrature-phase portion of the baseband signal and to generate a second in-phase portion of the digital compensated signal;
- a third FIR filter adapted to receive a quadrature-phase portion of the baseband signal and to generate a quadrature-phase digital compensated signal; and
- a summing circuit adapted to combine the first in-phase portion of the digital compensated signal with the second in-phase portion of the digital compensated signal to generate an in-phase digital compensated signal, where the in-phase digital compensated signal and the quadrature-phase digital compensated signal comprise the digital compensated signal.

6. The apparatus as defined in claim 1, wherein the QDCSP is implemented in firmware.

7. The apparatus as defined in claim 1, wherein the second digital filter of the QDCSP further comprises:
- a first FIR filter adapted to receive an in-phase portion of the received baseband signal and to generate a first in-phase portion of the demodulated baseband signal;
- a second FIR filter adapted to receive a quadrature-phase portion of the received baseband signal and to generate a second in-phase portion of the demodulated baseband signal;
- a third FIR filter adapted to receive an in-phase portion of the received baseband signal and to generate a first quadrature-phase portion of the demodulated baseband signal;
- a fourth FIR filter adapted to receive a quadrature-phase portion of the received baseband signal and to generate a second quadrature-phase portion of the demodulated baseband signal;
- a first summing circuit adapted to combine the first in-phase portion of the demodulated baseband signal with the second in-phase portion of the demodulated baseband signal to generate an in-phase demodulated baseband signal; and
- a second summing circuit adapted to combine the first quadrature-phase portion of the demodulated baseband signal with the second quadrature-phase portion of the demodulated baseband signal to generate a quadrature-phase demodulated baseband signal, where the in-phase demodulated baseband signal and the quadrature-phase demodulated baseband signal comprise the demodulated baseband signal.

8. The apparatus as defined in claim 1, wherein the second digital filter of the QDCSP further comprises:
- a first register adapted to store a first value that is related to a DC offset in an in-phase portion of the received baseband signal;
- a second register adapted to store a second value that is related to a DC offset in a quadrature-phase portion of the received baseband signal;
- a first summing circuit adapted to combine the first value with the in-phase portion of the received baseband signal to produce an in-phase portion of a reduced offset received baseband signal;
- a second sunning circuit adapted to combine the second value with the quadrature-phase portion of the received baseband signal to produce a quadrature-phase portion of the reduced offset received baseband signal;
- a first FIR filter adapted to receive the in-phase portion of the reduced offset received baseband signal and to generate a first in-phase portion of the demodulated baseband signal;
- a second FIR filter adapted to receive a quadrature-phase portion of the reduced offset received baseband signal and to generate a second in-phase portion of the demodulated baseband signal;
- a third FIR filter adapted to receive an in-phase portion of the reduced offset received baseband signal and to generate a first quadrature-phase portion of the demodulated baseband signal;
- a fourth FIR filter adapted to receive a quadrature-phase portion of the reduced offset received baseband signal and to generate a second quadrature-phase portion of the demodulated baseband signal;
- a third summing circuit adapted to combine the first in-phase portion of the demodulated baseband signal with the second in-phase portion of the demodulated baseband signal to generate an in-phase demodulated baseband signal; and
- a fourth summing circuit adapted to combine the first quadrature-phase portion of the demodulated baseband signal with the second quadrature-phase portion of the demodulated baseband signal to generate a quadrature-phase demodulated baseband signal, where the in-phase demodulated baseband signal and the quadrature-phase demodulated baseband signal comprise the demodulated baseband signal.

9. The apparatus as defined in claim 1, wherein the second digital filter of the QDCSP further comprises:
- a first FIR filter adapted to receive an in-phase portion of the received baseband signal and to generate an in-phase demodulated baseband signal;
- a second FIR filter adapted to receive an in-phase portion of the received baseband signal and to generate a first quadrature-phase portion of the demodulated baseband signal;
- a third FIR filter adapted to receive a quadrature-phase portion of the received baseband signal and to generate a second quadrature-phase portion of the demodulated baseband signal; and
- a summing circuit adapted to combine the first quadrature-phase portion of the demodulated baseband signal with the second quadrature-phase portion of the demodulated baseband signal to generate a quadrature-phase demodulated baseband signal, where the in-phase demodulated baseband signal and the quadrature-phase demodulated baseband signal comprise the demodulated baseband signal.

10. The apparatus as defined in claim 1, wherein the second digital filter of the QDCSP further comprises:
a first FIR filter adapted to receive an in-phase portion of the received baseband signal and to generate a first in-phase portion of the demodulated baseband signal;
a second FIR filter adapted to receive a quadrature-phase portion of the received baseband signal and to generate a second in-phase portion of the demodulated baseband signal;
a third FIR filter adapted to receive a quadrature-phase portion of the received baseband signal and to generate a quadrature-phase demodulated baseband signal; and
a summing circuit adapted to combine the first in-phase portion of the demodulated baseband signal with the second in-phase portion of the demodulated baseband signal to generate an in-phase demodulated baseband signal, where the in-phase demodulated baseband signal and the quadrature-phase demodulated baseband signal comprise the demodulated baseband signal.

11. The apparatus as defined in claim 1, further comprising a coupler adapted to provide the sample signal from an output of a radio frequency amplifier, where the quadrature modulated output signal is applied as an input to the radio frequency amplifier.

12. The apparatus as defined in claim 1, further comprising a coupler adapted to provide the sample signal from the quadrature modulated output signal.

13. The apparatus as defined in claim 1, where the ACPCE circuit is configured to monitor the baseband signal and the received baseband signals in short bursts of time between about 50 microseconds to about 200 microseconds, and is further configured to store the monitored signals in a memory device.

14. The apparatus as defined in claim 1, wherein the local oscillator frequency is radio frequency (RF).

15. The apparatus as defined in claim 1, wherein the local oscillator frequency is intermediate frequency (IF).

16. The apparatus as defined in claim 15, further comprising a frequency upconverter adapted to receive a signal as an input that includes the quadrature modulated output signal and to mix the signal with an RF signal.

17. The apparatus as defined in claim 1, wherein the ground signal switched by the termination switch is alternating current (AC) coupled to ground.

18. The apparatus as defined in claim 1, wherein the ACPCE circuit is configured to provide a test signal, and the QMCSP is configured to accept the test signal, and where the test signal includes test tones that enable the QDCSP to detect quadrature impairment characterstics.

19. The apparatus as defined in claim 1, wherein the ACPCE circuit is configured to provide updates to the first digital filter and to the second digital filter through state parameter vectors to the QMCSP and the QDCSP, respectively, to update instructions that negate the quadrature impairment.

20. The apparatus as defined in claim 19, wherein the QMCSP is adapted to activate the updates substantially simultaneously.

21. The apparatus as defined in claim 1, wherein the ACPCE circuit is configured to activate the phase shifter control signal to select the phase shift of the phase shifted output signal to measure quadrature impairment characteristics of the AQMS and the AQDS.

22. The apparatus as defined in claim 21, wherein the ACPCE circuit is configured to activate the ground switch control to characterize a DC offset corresponding to a selected phase shift.

23. The apparatus as defined in claim 1, wherein the AQDS is filter coupled to a receive path from an antenna to receive a transmitted signal from an external transmitter so that the AQDS demodulates the transmitted signal.

24. A method of quadrature modulating baseband signals and demodulating a sample signal, the method comprising:
receiving an input signal in digital form, where the input signal includes both an in-phase portion and a quadrature-phase portion;
applying a first time-domain impulse response to the input signal to convert the input signal to a digital compensated signal, where the digital compensated signal substantially negates a quadrature impairment associated with a forward modulation path;
converting the digital compensated signal from digital to an analog version;
quadrature modulating, in an analog quadrature modulator, the analog version of the digital compensated signal to a quadrature modulated signal;
receiving the sample signal of the quadrature modulated signal;
applying the sample signal as an input to an analog quadrature demodulator and quadrature demodulating the sample signal to a quadrature demodulated sample signal;
converting the quadrature demodulated sample signal from analog to a digital version;
applying a second time-domain impulse response to the digital version of the quadrature demodulated sample signal to convert the digital version of the quadrature demodulated sample signal to a demodulated baseband signal, where the second time-domain impulse response substantially negates a quadrature impairment associated with a reverse demodulation path;
receiving and storing at least a portion of the input signal in a memory;
receiving and storing at least a portion of the demodulated baseband signal in the memory;
analyzing the at least portions of the input signal and the demodulated baseband signal;
characterizing the quadrature impairment characteristics associated with the forward modulation path in frequency domain by computing a first set of transfer functions of the quadrature impairments;
computing a second set of transfer functions in frequency domain, where the second set of transfer functions comprises complements to the first set of transfer functions; and
converting the second set of transfer functions from frequency domain to produce the time domain impulse responses used in the digital filtering of the input signal and the digital version of the quadrature demodulated signal.

25. The method as defined in claim 24, further comprising applying a ground signal as an input to the analog quadrature demodulator to detect a DC offset.

26. The method as defined in claim 24, further comprising phase rotating a local oscillator signal applied to the analog quadrature demodulator relative a local oscillator signal applied to the analog quadrature modulator to characterize the first set of transfer functions.

27. The method as defined in claim 24, further comprising:
receiving a plurality of baseband input signals at a plurality of frequencies; and
digitally combining the plurality of baseband input signals to create the input signal.

28. The method as defined in claim 24, further comprising:
   detecting an absence of transmission by an RF amplifier associated with the input signal;
   receiving an external signal transmitted by an external transmitter; and
   applying the external signal as an input to the analog quadrature demodulator and demodulating the external signal.

29. The method as defined in claim 24, further comprising:
   compensating for a DC offset associated with the forward modulation path by combining the digital compensated signal with a first calculated DC offset; and
   compensating for a DC offset associated with the reverse demodulation path by combining the received baseband signal with a second calculated DC offset.

* * * * *

UNITED STATES PATENT AND TRADEMARK OFFICE
CERTIFICATE OF CORRECTION

PATENT NO. : 6,940,916 B1
APPLICATION NO. : 09/771144
DATED : September 6, 2005
INVENTOR(S) : Warner et al.

It is certified that error appears in the above-identified patent and that said Letters Patent is hereby corrected as shown below:

At column 2, line 8, please delete "J Roome," and insert -- J. Roome, --, therefor.

At column 2, line 13, please delete "48," and insert -- 46, --, therefor.

At column 5, line 32, please delete "x(t)y(t) : The "" symbol"

and insert -- $x(t) \otimes y(t)$ : The " $\otimes$ " symbol --, therefor.

At column 15, line 5-11, please delete "$z(t) = x(t)[h_{am}(t)h_{cm}(t) + h_{bm}(t) + x^*(t)[h_{am}(t)h_{dm}(t) + h_{bm}(t)h_{cm}^*(t)]$"

and insert -- $z(t) = x(t) \otimes [h_{am}(t) \otimes h_{cm}(t) + h_{bm}(t) \otimes h_{dm}^*(t) + x^*(t) \otimes [h_{am}(t) \otimes h_{dm}(t) + h_{bm}(t) \otimes h_{cm}^*(t)]$ --, therefor.

At column 15, line 20, please delete " $h_{am}(t)h_{dm}(t) + h_{bm}(t)h_{cm}^*(t) = 0$ "

and insert -- $h_{am}(t) \otimes h_{dm}(t) + h_{bm}(t) \otimes h_{cm}^*(t) = 0$ --, therefor.

At column 15, line 34, please delete " $h_{am}(t)h_{cm}(t) + h_{bm}(t)h_{dm}^*(t) = \delta(t)$ "

and insert -- $h_{am}(t) \otimes h_{cm}(t) + h_{bm}(t) \otimes h_{dm}^*(t) = \delta(t)$ --, therefor.

At column 19, line 22-32, please delete " $z(t) = x(t)[h_{ad}(t)h_{cd}(t) + h_{bd}^*(t)h_{dd}(t) + x^*(t)[h_{ad}^*(t)h_{dd}(t) + h_{bd}(t)h_{cd}(t)]$ "

and insert -- $z(t) = x(t) \otimes [h_{ad}(t) \otimes h_{cd}(t) + h_{bd}^*(t) \otimes h_{dd}(t)] + x^*(t)[h_{ad}^*(t) \otimes h_{dd}(t) + h_{bd}(t) \otimes h_{cd}(t)]$ --, therefor.

UNITED STATES PATENT AND TRADEMARK OFFICE
CERTIFICATE OF CORRECTION

PATENT NO.        : 6,940,916 B1
APPLICATION NO.   : 09/771144
DATED             : September 6, 2005
INVENTOR(S)       : Warner et al.

It is certified that error appears in the above-identified patent and that said Letters Patent is hereby corrected as shown below:

At column 19, line 40, please delete " $h_{ad}*(t)h_{dd}(t) + h_{bd}(t)h_{cd}(t) = 0$ "

and insert -- $h_{ad}*(t) \otimes h_{dd}(t) + h_{bd}(t) \otimes h_{cd}(t) = 0$ --, therefor.

At column 19, line 55-56, please delete " $h_{ad}(t)h_{cd}(t) + h_{bd}*(t)h_{dd}(t) = \delta(t)$ "

and insert -- $h_{ad}(t) \otimes h_{cd}(t) + h_{bd}*(t) \otimes h_{dd}(t) = \delta(t)$ --, therefor.

At column 22, line 38, please delete "1114." and insert -- 114. --, therefor.

At column 23, line 14, please delete "116" and insert -- 116, --, therefor.

At column 27, line 63, please delete "1910" and insert -- 1910, --, therefor.

At column 28, line 63, please delete " $h_{iqd}(t) = \text{Im}[h_{cd}(t) + h_{dd}(t)]$ "

and insert -- $h_{iqd}(t) = \text{Im}[h_{cd}(t) + h_{dd}(t)] = 0$ --, therefor.

At column 30, line 40, in Claim 2, please delete "sunning" and insert -- summing --, therefore.

At column 30, line 66, in Claim 3, please delete "quadrature phase" and insert -- quadrature–phase --, therefor.

At column 32, line 17, in Claim 8, please delete "sunning" and insert -- summing --, therefor.

At column 33, line 42, in Claim 16, please delete "signal" and insert -- signal, --, therefor.

UNITED STATES PATENT AND TRADEMARK OFFICE
CERTIFICATE OF CORRECTION

PATENT NO. : 6,940,916 B1
APPLICATION NO. : 09/771144
DATED : September 6, 2005
INVENTOR(S) : Warner et al.

It is certified that error appears in the above-identified patent and that said Letters Patent is hereby corrected as shown below:

At column 34, line 2, in Claim 23, please delete "filter" and insert -- further --, therefor.

Signed and Sealed this

Fifth Day of June, 2007

JON W. DUDAS
*Director of the United States Patent and Trademark Office*